US012680571B2

(12) United States Patent
Wang et al.

(10) Patent No.: US 12,680,571 B2
(45) Date of Patent: Jul. 14, 2026

(54) HINGE MECHANISM AND ELECTRONIC DEVICE

(71) Applicant: Huawei Technologies Co., Ltd., Shenzhen (CN)

(72) Inventors: Xuechan Wang, Dongguan (CN); Hewen Shen, Dongguan (CN); Li Liao, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 161 days.

(21) Appl. No.: 18/830,156

(22) Filed: Sep. 10, 2024

(65) Prior Publication Data

US 2024/0426336 A1      Dec. 26, 2024

Related U.S. Application Data

(63) Continuation of application No. PCT/CN2024/080376, filed on Mar. 6, 2024.

(30) Foreign Application Priority Data

Mar. 22, 2023      (CN) ......................... 202310318227.X

(51) Int. Cl.
$H05K\ 5/02$          (2006.01)
$F16C\ 11/04$          (2006.01)
(Continued)

(52) U.S. Cl.
CPC ............ *F16C 11/04* (2013.01); *H05K 5/0226* (2013.01); *E05D 3/122* (2013.01); *E05D 11/082* (2013.01);
(Continued)

(58) Field of Classification Search
CPC   F16C 11/04; F16C 11/10; F16C 11/12; F16C 11/103; H05K 5/0226; H05K 5/02;
(Continued)

(56) References Cited

U.S. PATENT DOCUMENTS 11,589,471 B2 *   2/2023   Zhang ................... G06F 1/1616
11,681,335 B1 *   6/2023   Hsu ....................... G06F 1/1681
361/679.01

(Continued)

FOREIGN PATENT DOCUMENTS

CN            209724948 U      12/2019
JP            1987062011 U      4/1987
(Continued)

*Primary Examiner* — Imani N Hayman
*Assistant Examiner* — Hung Q Dang
(74) *Attorney, Agent, or Firm* — Slater Matsil, LLP

(57)                    ABSTRACT

The hinge mechanism includes a base, a first rotation assembly, a second rotation assembly, and a damping assembly. The damping assembly includes an elastic module and an even number of friction assemblies. Each friction assembly includes an intermediate shaft and a gear member. The intermediate shaft includes a shaft body and a mounting part. The shaft body is connected to the base. The mounting part is disposed on the shaft body. The mounting part has a tapered groove. The gear member includes an insertion part. The insertion part has a tapered face, and the insertion part is inserted into the tapered groove. The tapered face abuts against a groove face of the tapered groove under an action of elastic force of the elastic module. A first swing arm of the first rotation assembly and a second swing arm of the second rotation group rotate around the base.

20 Claims, 8 Drawing Sheets

(51) Int. Cl.

| | | |
|---|---|---|
| *E05D 3/12* | (2006.01) | |
| *E05D 11/08* | (2006.01) | |

(52) U.S. Cl.
CPC ..... *E05Y 2201/26* (2013.01); *E05Y 2201/266* (2013.01)

(58) Field of Classification Search
CPC ... E05D 3/122; E05D 11/082; E05Y 2201/26; E05Y 2201/266; G06F 1/1681; G06F 1/16; H04M 1/022; H04M 1/0208; G09F 9/301; G09F 9/30
See application file for complete search history.

(56) References Cited

U.S. PATENT DOCUMENTS

| | | | | |
|---|---|---|---|---|
| 11,846,998 | B2 * | 12/2023 | Wu ....................... | H05K 5/0226 |
| 12,028,470 | B2 * | 7/2024 | Wang .................. | H04M 1/0268 |
| 12,082,359 | B2 * | 9/2024 | Wang ................... | G06F 1/1681 |
| 12,314,091 | B2 * | 5/2025 | Cheng .................. | H04M 1/022 |
| 12,591,277 | B2 * | 3/2026 | Hong ................... | G06F 1/1681 |
| 2023/0244274 | A1 | 8/2023 | Lin et al. | |

FOREIGN PATENT DOCUMENTS

| | | | |
|---|---|---|---|
| JP | 2009527702 | A | 7/2009 |
| JP | 2023506798 | A | 2/2023 |

* cited by examiner

HINGE MECHANISM AND ELECTRONIC DEVICE

CROSS-REFERENCE TO RELATED APPLICATIONS

This application is a continuation of International Application No. PCT/CN2024/080376, filed on Mar. 6, 2024, which claims priority to Chinese Patent Application No. 202310318227.X, filed on Mar. 22, 2023. The disclosures of the aforementioned applications are hereby incorporated by reference in their entireties.

TECHNICAL FIELD

This application relates to the field of foldable electronic device technologies, and in particular, to a hinge mechanism and an electronic device.

BACKGROUND

As flexible display technologies gradually become mature, display manners of electronic devices change greatly. A mobile phone with a foldable flexible display, a tablet computer with a foldable flexible display, a wearable electronic device with a foldable flexible display, and the like are an important evolution direction of intelligent electronic devices in the future.

A hinge mechanism is used as a key component in a process of switching a folding mode of a foldable electronic device, and folding reliability and operation experience of the foldable electronic device depend on performance of the hinge mechanism to a large extent. For example, retention of a folded state, an unfolded state, or an intermediate state of the foldable electronic device is implemented depending on damping force provided by a damping assembly in the hinge mechanism. However, some current damping assemblies provide small damping force. Although the damping assemblies may provide effective damping force for retention of the folded state or the unfolded state of the foldable electronic device, it is very difficult to implement hover in the intermediate state, greatly affecting user experience.

In view of this, how to implement hover of the foldable electronic device in the intermediate state has become a difficult problem to be urgently resolved by a person skilled in the art.

SUMMARY

This application provides a hinge mechanism and an electronic device, to implement a hover function of the electronic device in any rotation state, so as to improve user experience.

According to a first aspect, this application provides a hinge mechanism. The hinge mechanism may include a base, a first rotation assembly, a second rotation assembly, and a damping assembly. The first rotation assembly and the second rotation assembly are respectively disposed on two opposite sides of the base. The damping assembly includes an elastic module and an even number of friction assemblies. Each friction assembly includes an intermediate shaft and a gear member. The intermediate shaft includes a shaft body and a mounting part. The shaft body is connected to the base. The mounting part is disposed on the shaft body. The mounting part has a tapered groove. An opening of the tapered groove is provided facing a direction of the gear member. The gear member is rotatably connected to the intermediate shaft, and the gear member includes an insertion part. The insertion part has a tapered face, and the insertion part is inserted into the tapered groove. In addition, the tapered face abuts against a groove face of the tapered groove under an action of elastic force of the elastic module in an extension direction of an axis of the intermediate shaft. In addition, gear members of the even number of friction assemblies may be located between the first rotation assembly and the second rotation assembly, and gear faces of two adjacent gear members are engaged with each other. The first rotation assembly and the second rotation assembly may be used as drive components for the gear member to rotate around the intermediate shaft. Specifically, the first rotation assembly includes a first swing arm. The first swing arm is rotatably connected to the base. The second rotation assembly includes a second swing arm. The second swing arm is rotatably connected to the base. In addition, a first gear face is disposed at an end that is of the first swing arm and that faces the even number of gear members. A second gear face is disposed at an end that is of the second swing arm and that faces the even number of gear members. The first gear face is engaged with a gear face of an adjacent gear member. The second gear face is engaged with a gear face of an adjacent gear member. In this case, in a process in which the first swing arm and the second swing arm rotate around the base, the gear member can be driven to rotate around the intermediate shaft. In addition, because the tapered face of the gear member abuts against the groove face of the mounting groove under the action of the elastic force of the elastic module, in a process in which the gear member rotates around the intermediate shaft, relative motion between the tapered face and the groove face of the mounting groove can generate friction force. The friction force can be applied to a foldable electronic device in which the hinge mechanism is used. The friction force exists when the electronic device is in any rotation state. Therefore, the friction force can be used as state retention force of the electronic device. The friction force can be used to implement a hover function of the electronic device in the any rotation state, to improve user experience.

In a possible implementation of this application, a groove wall of the tapered groove may be provided with at least two first notches. In this way, in a process of inserting the insertion part of the gear member into the tapered groove, the tapered groove can be deformed under an action of extrusion force of the insertion part. This can effectively increase abutting force between the tapered face and the groove face of the tapered groove. In a process in which the gear member rotates relative to the intermediate shaft, the abutting force can increase the friction force generated between the tapered face and the groove face of the tapered groove. In addition, the at least two first notches are arranged centrosymmetrically in a circumferential direction of the tapered groove. In this way, the at least two first notches are evenly distributed in the circumferential direction of the tapered groove. This helps improve uniformity of force transfer by the friction assemblies, thereby improving state retention stability of the electronic device in which the hinge mechanism is used.

In addition, the insertion part of the gear member may be provided with at least two second notches. In this way, in the process in which the insertion part is inserted into the tapered groove, the insertion part can be deformed under an action of extrusion force of the groove face of the tapered groove. Therefore, the abutting force between the tapered face and the groove face of the tapered groove is increased, to increase, in the process of rotating the gear member relative to the central shaft, the friction force generated between the tapered face and the groove face of the tapered groove. In addition, the at least two second notches are arranged centrosymmetrically in a circumferential direction of the insertion part. In this way, the at least two second notches are evenly distributed in the circumferential direction of the insertion part. This helps improve uniformity of force transfer by the friction assemblies, thereby improving state retention stability of the electronic device in which the hinge mechanism is used.

In a possible implementation of this application, the base may have an accommodation cavity. In addition, the damping assembly further includes a damping support. The damping support may be accommodated in the accommodation cavity, and the damping support may be fastened to the base. The damping support can be used as a positioning component of the damping assembly in the hinge mechanism. The shaft body of the intermediate shaft can be inserted into the damping support. This can help improve positioning accuracy of the damping assembly in the hinge mechanism, and can effectively avoid deflection of the damping assembly relative to the base, thereby improving structural reliability of the hinge mechanism.

In this application, the first rotation assembly further includes a first rotating shaft. The first rotating shaft may penetrate the damping support, and the first swing arm is rotatably connected to the first rotating shaft. In this way, a rotatable connection between the first swing arm and the base can be implemented through rotation of the first swing arm around the first rotating shaft. In addition, the second rotation assembly further includes a second rotating shaft. The second rotating shaft may penetrate the damping support, and the second swing arm is rotatably connected to the second rotating shaft. In this way, a rotatable connection between the second swing arm and the base can be implemented through rotation of the second swing arm around the second rotating shaft.

In a possible implementation of this application, the first swing arm includes a first rotation part. A first avoidance opening is disposed at first rotation part. The second swing arm includes a second rotation part. A second avoidance opening is disposed on the second rotation part. In addition, the damping support includes a first connection part and a second connection part. The first connection part is inserted into the first avoidance opening. The first rotating shaft penetrates both the first rotation part and the first connection part. The second connection part is inserted into the second avoidance opening. The second rotating shaft penetrates both the second rotation part and the second connection part. In this way, a structure of the hinge mechanism can be compact when a rotatable connection between the first swing arm and the damping support and a rotatable connection between the second swing arm and the damping support can be implemented. This helps implement a miniaturization design of the hinge mechanism.

It should be noted that, when no damping support is disposed on the damping assembly, the first rotating shaft and the second rotating shaft may be mounted on the base. For example, mounting holes may be separately disposed on the base corresponding to the first rotating shaft and the second rotating shaft. In this way, the first rotating shaft and the second rotating shaft respectively penetrate the corresponding mounting holes, to implement functions such as supporting and limiting for the first rotating shaft and the second rotating shaft by using the base.

In a possible implementation of this application, the first swing arm further includes a first drive part. The first drive part is detachably connected to the first rotation part. The first drive part and the first rotation part are relatively fastened in a rotation direction of the first swing arm. In this case, the first gear face is disposed at the first rotation part, or the first gear face is disposed at the first drive part. In addition, because the first gear face can be engaged with the gear face of the adjacent gear member, the gear member can be driven, through rotation of the first swing arm, to rotate around the intermediate shaft.

Similarly, the second swing arm includes a second drive part. The second drive part is detachably connected to the second rotation part. The second drive part and the second rotation part are relatively fastened in a rotation direction of the second swing arm. The second gear face is disposed at the second rotation part, or the second gear face is disposed at the second drive part. In addition, because the second gear face can be engaged with the gear face of the adjacent gear member, the gear member can be driven, through rotation of the second swing arm, to rotate around the intermediate shaft.

In a possible implementation of this application, the damping assembly may further include a first conjoined cam. The first conjoined cam may be sleeved on the first rotating shaft and the second rotating shaft. The first conjoined cam is located between the elastic module and the first swing arm, and the first conjoined cam is located between the elastic module and the second swing arm. In addition, an end that is of the first swing arm and that faces the first conjoined cam has a first cam face. An end that is of the second swing arm and that faces the first conjoined cam has a second cam face. An end that is of the first conjoined cam and that faces the first swing arm has a third cam face. An end that is of the first conjoined cam and that faces the second swing arm has a fourth cam face.

The first cam face abuts against the third cam face under the action of the elastic force of the elastic module in an extension direction of an axis of the first rotating shaft. The second cam face abuts against the fourth cam face under the action of the elastic force of the elastic module in an extension direction of an axis of the second rotating shaft. In this way, in a process in which the first swing arm rotates around the first rotating shaft and a process in which the second swing arm rotates around the second rotating shaft, damping force can be generated by using the cam faces abutting against each other. Due to existence of the damping force, a self-unfolding function of the electronic device in an end phase of an unfolded state or a self-closing function of the electronic device in an end phase of a closed state can be implemented. In addition, under an action of the damping force, a user can have an obvious frustration hand feeling in a process of opening or closing the electronic device, to improve user experience.

In addition, both the friction force generated by the relative rotation between the tapered face and the groove face of the tapered groove in the hinge mechanism and the damping force generated by the cam faces abutting against each other exist. This can help increase damping force provided by the entire hinge mechanism. Therefore, the electronic device in which the hinge mechanism is used can stably hover in the any rotation state. In addition, because the foregoing two portions of force are decoupled from each other, the two portions of force can exist independently. As a result, when one portion of force fails to function, an effect of the electronic device can be achieved under an action of the other portion of force. For example, when the friction assembly is worn out, the damping force generated by the cam faces abutting against each other can also provide specific state retention force for the electronic device, to implement the hover function of the electronic device in the rotation state. For another example, when the cam faces abutting against each other are worn out, because the friction force exists, the user can also have an obvious damping hand feeling in the process in which the user opens or closes the electronic device.

In a possible implementation of this application, the damping assembly further includes a first limiting member. The elastic module is located between the first conjoined cam and the first limiting member. One end of the first limiting member may be clamped to the first rotating shaft for limiting, and the other end of the first limiting member may be clamped to the second rotating shaft for limiting. The elastic module abuts against the first limiting member in the extension direction of the axis of the first rotating shaft. In this way, components disposed on the first rotating shaft and the second rotating shaft can be effectively prevented from falling off from the corresponding rotating shafts, to improve structural reliability of the hinge mechanism.

When the first limiting member is specifically clamped to the first rotating shaft and the second rotating shaft for limiting, a first contraction part may be disposed on the first rotating shaft, a second contraction part may be disposed on the second rotating shaft, and a first bayonet and a second bayonet may be disposed on the first limiting member. In this way, the first bayonet can be clamped at the first contraction part, and the second bayonet can be clamped at the second contraction part. As a result, the first limiting member can be reliably connected to the first rotating shaft and the second rotating shaft.

To further increase the damping force generated by the hinge mechanism, a fifth cam face may be disposed at an end that is of the gear member and that faces the first conjoined cam, and a sixth cam face is disposed at an end that is of the first conjoined cam and that faces each gear member. In addition, a fifth cam abuts against a sixth cam under the action of the elastic force of the elastic module in the extension direction of the axis of the intermediate shaft. In this way, the damping force provided by the hinge mechanism is increased by increasing the cam faces abutting against each other.

In addition, the damping assembly may further include a second limiting member. The second limiting member is located between the first conjoined cam and the elastic module, and the second limiting member may be clamped to each intermediate shaft for limiting. The first conjoined cam abuts against the second limiting member. In addition, the fifth cam face abuts against the sixth cam face under an action of abutting force between the first conjoined cam and the second limiting member in the extension direction of the axis of each intermediate shaft. The second limiting member can limit movement of the first conjoined cam along the intermediate shaft, to ensure that the fifth cam face reliably abuts against the sixth cam face. This improves stability of damping force generated by the fifth cam face and the sixth cam face in a relative motion process.

When the second limiting member is clamped to each intermediate shaft for limiting, a third contraction part may be disposed on the shaft body of each intermediate shaft. The third contraction part includes a shoulder. The second limiting member may be located between the first conjoined cam and the shoulder in the extension direction of the axis of each intermediate shaft. In addition, the second limiting member abuts against the shoulder when the top of a protrusion part of the fifth cam face is flush with the top of a protrusion part of the sixth cam face. In this case, the shoulder of the third contraction part can limit a maximum distance at which the first limiting member moves along the intermediate shaft in a direction away from the gear member, and also limit a maximum distance at which the first conjoined cam moves in the direction away from the gear member. This ensures that the fifth cam face reliably abuts against the sixth cam face.

In a possible implementation of this application, the damping assembly may further include a second conjoined cam. The second conjoined cam is sleeved on the first rotating shaft and the second rotating shaft. The first swing arm is located between the first conjoined cam and the second conjoined cam. The second swing arm is located between the first conjoined cam and the second conjoined cam. In addition, a seventh cam face is disposed at an end that is of the first swing arm and that faces the second conjoined cam. An eighth cam face is disposed at an end that is of the second swing arm and that faces the second conjoined cam. An end that is of the second conjoined cam and that faces the first swing arm has a ninth cam face. An end that is of the second conjoined cam and that faces the second swing arm has a tenth cam face. The seventh cam face abuts against the ninth cam face under the action of the elastic force of the elastic module in the extension direction of the axis of the first rotating shaft. The eighth cam face abuts against the tenth cam face under the action of the elastic force of the elastic module in the extension direction of the axis of the second rotating shaft. In this way, damping force that can be provided by the damping assembly is increased by adding the cam faces abutting against each other, so that the user has a more obvious damping hand feeling in the process in which the user opens or closes the electronic device.

In a possible implementation of this application, the damping assembly further includes a connector. The connector is sleeved on the first rotating shaft and the second rotating shaft. The first swing arm is located between the connector and the first conjoined cam. The second swing arm is located between the connector and the first conjoined cam. A first plane is disposed at an end that is of the first swing arm and that faces the second connector. A second plane is disposed at an end that is of the second swing arm and that faces the second connector. An end that is of the second connector and that faces the first swing arm has a third plane. An end that is of the second conjoined cam and that faces the second swing arm has a fourth plane. The first plane abuts against the third plane under the action of the elastic force of the elastic module in the extension direction of the axis of the first rotating shaft. The second plane abuts against the fourth plane under the action of the elastic force of the elastic module in the extension direction of the axis of the second rotating shaft. In a process in which the first swing arm and the second swing arm rotate relative to the base, friction force is also generated when relative motion occurs between the planes abutting against each other. The friction force may also be used as the state retention force of the electronic device, to improve stability of hover of the electronic device in the any rotation state.

According to a second aspect, this application further provides an electronic device. The electronic device includes a first housing, a second housing, and the hinge mechanism according to the first aspect. The first housing and the second housing are respectively disposed on two opposite sides of the hinge mechanism. The first swing arm is slidably connected to the first housing, and the second swing arm is slidably connected to the second housing.

In the electronic device provided in this application, friction force provided by the hinge mechanism can be transferred to the first housing by using the first swing arm, and transferred to the second housing by using the second swing arm. Because the hinge mechanism can provide large friction force in any rotation state, a hover function of the electronic device in the any rotation state can be implemented, to improve user experience.

BRIEF DESCRIPTION OF THE DRAWINGS

FIG. 2b is an exploded view of the electronic device shown in FIG. 2a;

FIG. 7b is a front view of the intermediate shaft shown in FIG. 7a;

FIG. 9b is a cross-sectional view of the structure shown in FIG. 9a;

REFERENCE NUMERALS

Figure 1:
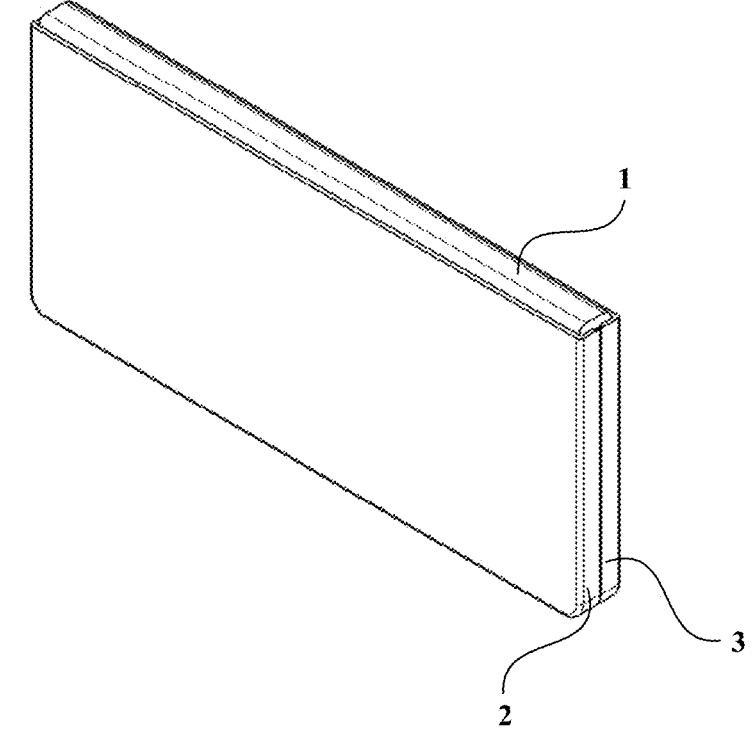
FIG. 1 is a diagram of a structure of an electronic device in a closed state according to an embodiment of this application.

1: hinge mechanism; 11: first end cam; 1101: first slope; 1102: first plane; 12: second end cam;
1201: second slope; 1202: second plane;
101: first rotation assembly; 1011: first swing arm; 10111: first rotation part; 101111: first avoidance opening; 101112: first gear face; 101113: first cam face; 101114: seventh cam face; 101115: first plane;
1012: first rotating shaft; 10121: first stop part; 10122: first contraction part;
102: second rotation assembly; 1021: second swing arm; 10211: second rotation part; 102111: second avoidance opening;

102112: second gear face; 102113: second cam face; 102114: eighth cam face; 102115: second plane;
1022: second rotating shaft; 10221: second stop part; 10222: second contraction part;
103: damping assembly; 1031: friction assembly; 10311: intermediate shaft; 103111: shaft body; 103112: mounting part;
1031121: tapered groove; 10311211: groove face; 10311212: first notch; 103113: third contraction part;
1031131: shoulder; 10312: gear member; 103121: insertion part; 1031211: tapered face; 1031212: second notch;
103122: fifth cam face;
1032: damping support; 10321: first connection part; 10322: second connection part; 1033: elastic module;
1034: first conjoined cam; 10341: third cam face; 10342: fourth cam face; 10343: sixth cam face;
10344: accommodation slot;
1035: second conjoined cam; 10351: ninth cam face; 10352: tenth cam face;
1036: first limiting member; 10361: first bayonet; 10362: second bayonet;
1037: second limiting member; 10371: third bayonet;
1038: fixing mount; 1039: connector; 10391: third plane; 10392: fourth plane; 104: base; 1041: accommodation cavity; and
2: first housing; 3: second housing; 4: flexible display.

DESCRIPTION OF EMBODIMENTS

To make the objectives, technical solutions, and advantages of this application clearer, the following further describes this application in detail with reference to the accompanying drawings. Terms used in the following embodiments of this application are merely intended to describe specific embodiments, but are not intended to limit this application. The terms "one", "a", "the", "the foregoing", "this", and "the one" of singular forms used in this specification and the appended claims of this application are also intended to include expressions such as "one or more", unless otherwise specified in the context clearly.

Reference to "an embodiment", "some embodiments", or the like described in this specification indicates that one or more embodiments of this application include a specific feature, structure, or characteristic described with reference to the embodiment. Therefore, statements "in an embodiment", "in some embodiments", "in some other embodiments", "in other embodiments", and the like that appear in different places in this specification do not necessarily mean referring to a same embodiment. Instead, the statements mean "one or more but not all of embodiments", unless otherwise specifically emphasized in another manner. The terms "include", "comprise", "have", and variants of the terms all mean "include but are not limited to", unless otherwise specifically emphasized in another manner.

For ease of understanding of a hinge mechanism and an electronic device provided in embodiments of this application, the following first describes an application scenario. The hinge mechanism may be but is not limited to being used in a foldable electronic device like a mobile phone, a personal digital assistant (PDA), a notebook computer, or a tablet computer. When the hinge mechanism provided in embodiments of this application is used in an electronic device, refer to FIG. 1. FIG. 1 is a diagram of a structure of an electronic device according to an embodiment of this application. In the embodiment shown in FIG. 1, the electronic device is in a closed state. In addition to a hinge mechanism 1, the electronic device may further include two housings and a flexible display (not shown in FIG. 1). For ease of description, in this application, the two housings of the electronic device may be respectively named a first housing 2 and a second housing 3. The first housing 2 and the second housing 3 are located on two sides of the hinge mechanism 1, and may rotate around the hinge mechanism 1. The electronic device provided in this application may be an inward foldable electronic device. When being used, the electronic device may be closed or unfolded based on different use scenarios.

Figure 2A:
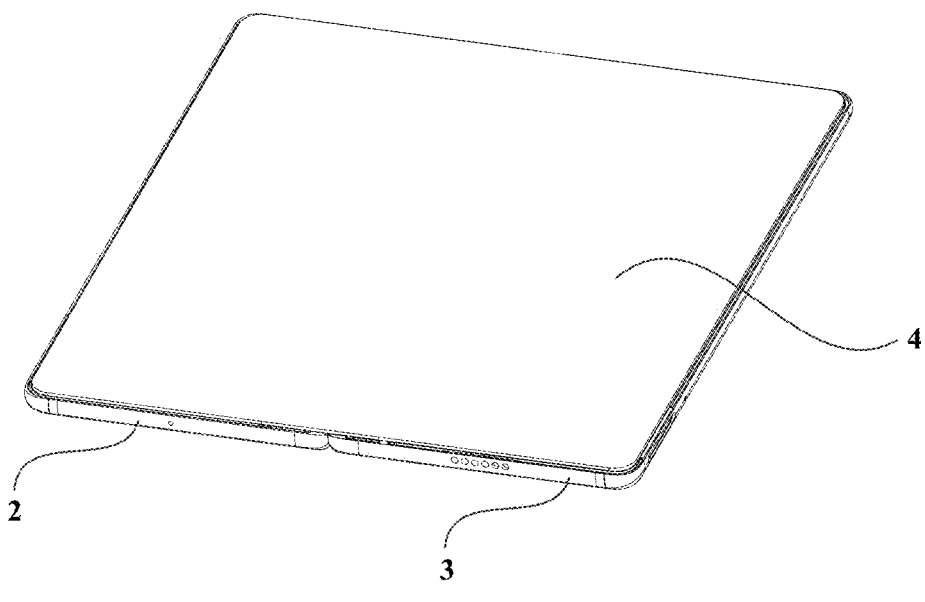
FIG. 2a is a diagram of a structure of an electronic device in an unfolded state according to an embodiment of this application.
Figure 2B:
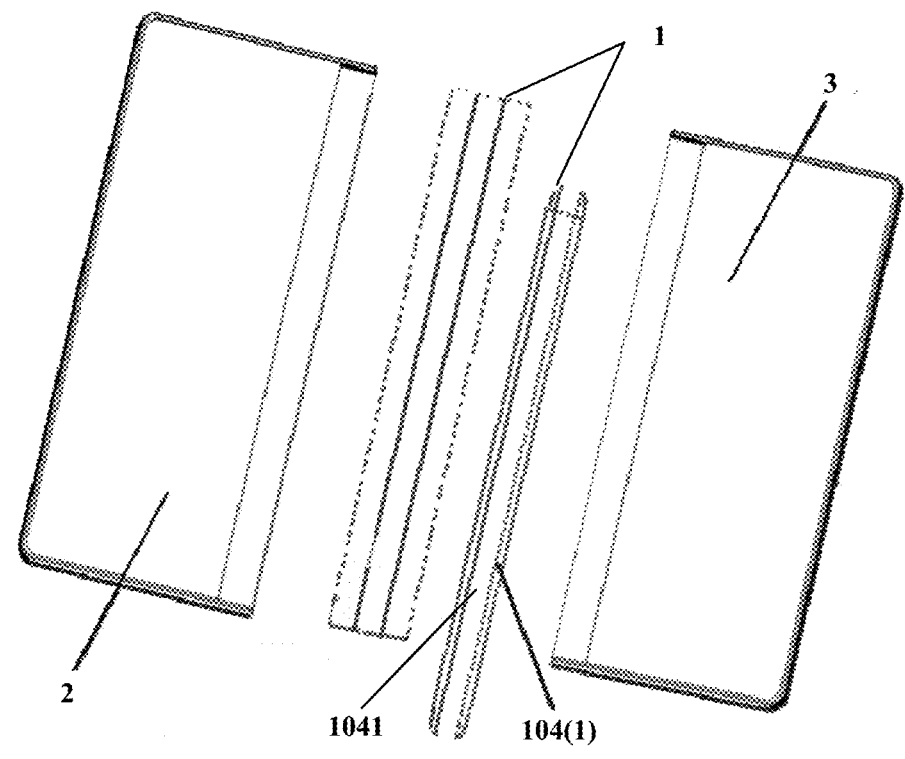

Refer to FIG. 2a. FIG. 2a is a diagram of a structure of the electronic device in an unfolded state. In addition, refer to FIG. 2b. FIG. 2b is an exploded view of the electronic device in FIG. 2a. The flexible display 4 is omitted in FIG. 2b. In this case, it can be learned from FIG. 2a and FIG. 2b that, in the unfolded state, the first housing 2 and the second housing 3 are still located on the two sides of the hinge mechanism 1, and the first housing 2 and the second housing 3 can support the flexible display 4, so that the flexible display 4 is in a flattened state.

It may be understood that a process in which the electronic device changes from the unfolded state shown in FIG. 2a to the closed state shown in FIG. 1 or from the closed state shown in FIG. 1 to the unfolded state shown in FIG. 2a is a process in which the first housing 2 and the second housing 3 rotate around the hinge mechanism 1. As a key functional component in the foldable electronic device, the hinge mechanism 1 may be disposed corresponding to a foldable portion of the flexible display 4. Therefore, the hinge mechanism 1 is important in supporting the foldable portion of the flexible display 4 in the unfolded state shown in FIG. 2a and in accommodating the foldable portion of the flexible display 4 in the closed state shown in FIG. 1.

Figure 3:
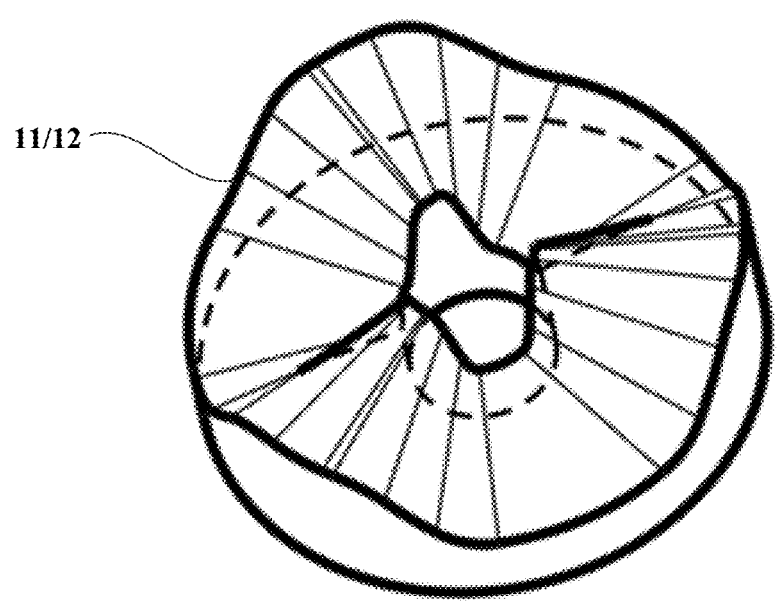
FIG. 3 is a diagram of a structure of an end cam of a damping assembly according to an embodiment of this application.
Figure 4:
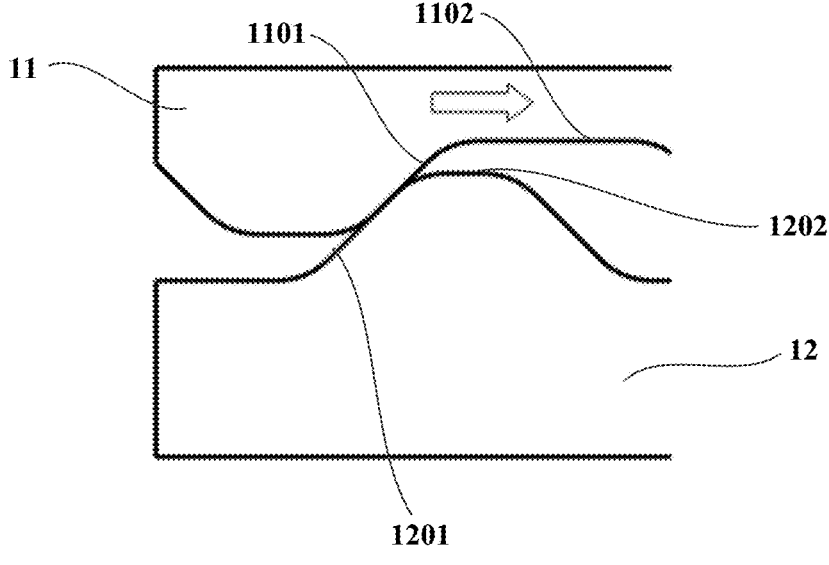
FIG. 4 is a diagram of a structure of a damping assembly in which two end cams are in contact according to an embodiment of this application.

In addition, a reliable structure of the hinge mechanism 1 may be important in implementing reliable movement of the electronic device and in retaining a state in a movement process. For example, the electronic device can be retained in the closed state shown in FIG. 1 or the unfolded state shown in FIG. 2a to a large extent depending on damping force provided by the hinge mechanism 1. Currently, an end cam structure shown in FIG. 3 is mostly used in hinge mechanisms 1 of some foldable electronic devices to provide damping force. FIG. 3 is a diagram of a structure of a first end cam 11 and/or a second end cam 12 according to a possible embodiment. When the electronic device is in the closed state or the unfolded state, refer to FIG. 4. FIG. 4 is a diagram of a structure in which two end cams are in contact according to an embodiment of this application. In this embodiment, effective state retention force may be provided through contact between a first slope 1101 of the first end cam 11 and a second slope 1201 of the second end cam 12. However, when the electronic device moves to an intermediate state between the closed state and the unfolded state, a first plane 1102 of the first end cam 11 is in contact with a second plane 1202 of the second end cam 12 to generate small damping force. In this case, because rebound force generated by the flexible display in a bent state is applied to the two housings, it is difficult for the electronic device to hover in the intermediate state, greatly reducing user experience.

The hinge mechanism provided in this application is intended to resolve the foregoing problem. Therefore, when the electronic device is in the closed state, the unfolded state, or the intermediate state, sufficient hover force can be provided for the electronic device, so that the electronic device can be stably retained in a corresponding state, to improve user experience. For ease of understanding of the hinge mechanism provided in embodiments of this application, the following describes a specific structure of the hinge mechanism in detail with reference to the accompanying drawings.

Figure 5:
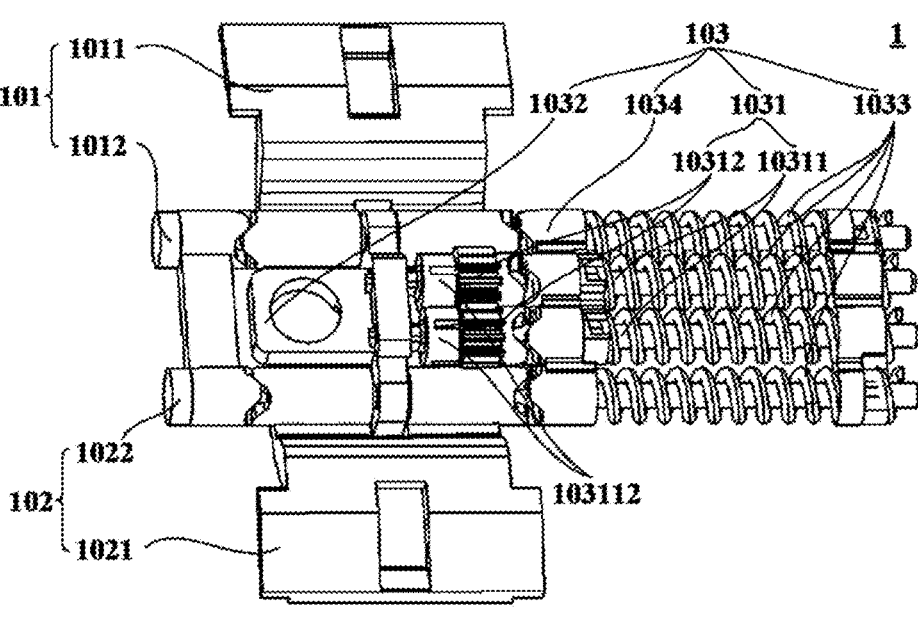
FIG. 5 is a diagram of a structure of a damping assembly according to an embodiment of this application.

First, refer to FIG. 2b. In this application, the hinge mechanism 1 may include a base 104. In addition, refer to FIG. 5. FIG. 5 is a diagram of a partial structure of the hinge mechanism according to an embodiment of this application. The hinge mechanism 1 may further include a first rotation assembly 101, a second rotation assembly 102, and a damping assembly 103. The first rotation assembly 101 and the second rotation assembly 102 are located on two opposite sides of the base 104, and the first rotation assembly 101 and the second rotation assembly 102 are rotatably connected to the base 104. In this application, the process in which the electronic device in which the hinge mechanism 1 is used changes from the unfolded state to the closed state is a process in which the first rotation assembly 101 and the second rotation assembly 102 rotate toward each other around the base 104, and the process in which the electronic device changes from the closed state to the unfolded state is a process in which the first rotation assembly 101 and the second rotation assembly 102 rotate away from each other around the base 104.

Figure 6A:
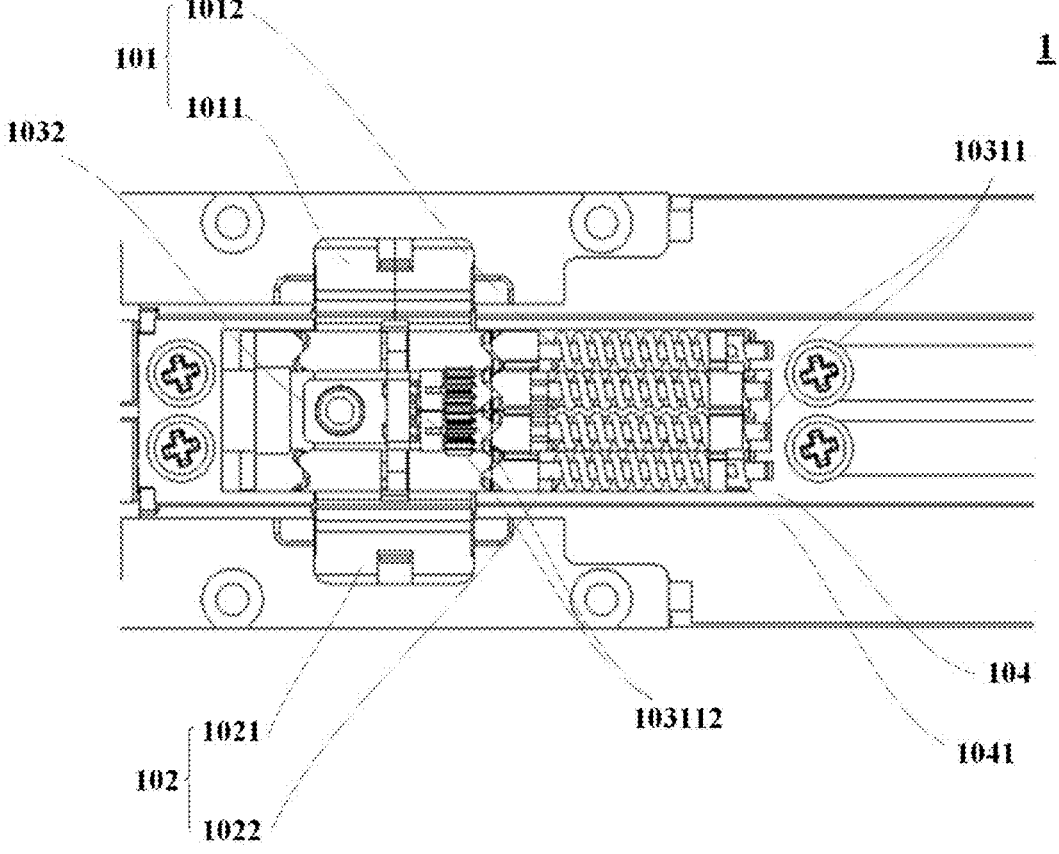
FIG. 6a is a diagram of a structure in which a damping assembly and a base are assembled according to an embodiment of this application.
Figure 6B:
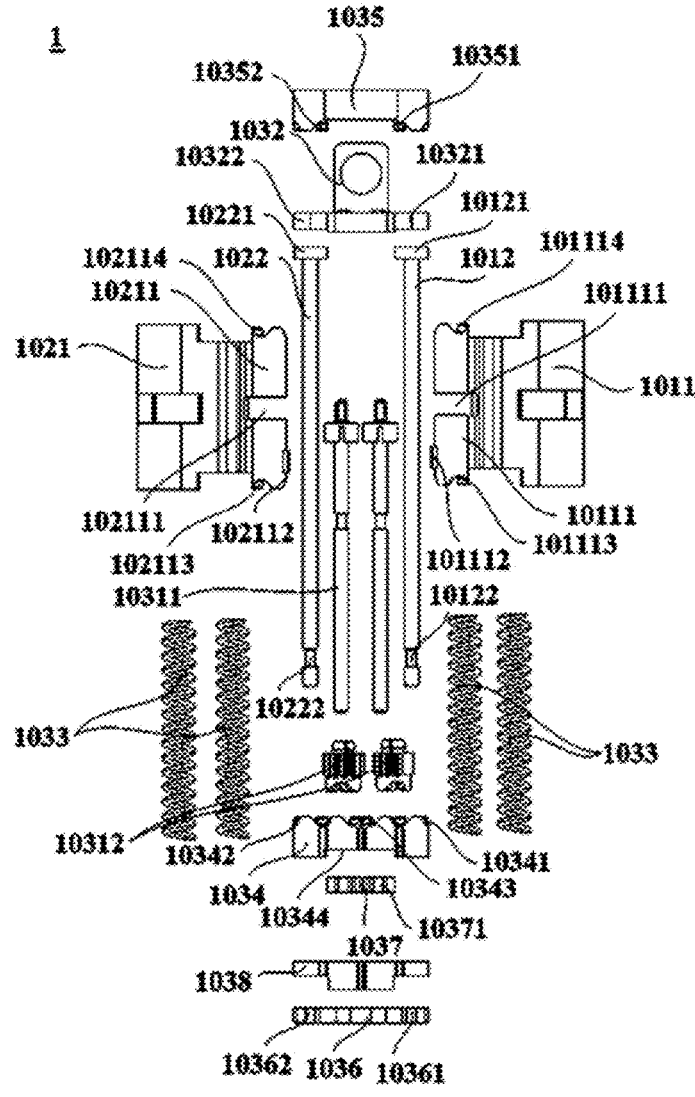
FIG. 6b is an exploded view of the damping assembly shown in FIG. 5.

Refer to FIG. 6a and FIG. 6b. FIG. 6a is a diagram of a structure in which the damping assembly 103 and the base 104 in the hinge mechanism 1 shown in FIG. 5 are assembled. FIG. 6b is an exploded view of the hinge mechanism 1 shown in FIG. 5. The first rotation assembly 101 may include a first swing arm 1011. The first swing arm 1011 is rotatably connected to the base 104 shown in FIG. 6a. During specific implementation, the first rotation assembly 101 may further include a first rotating shaft 1012. The first rotating shaft 1012 may be mounted on the base 104. The first swing arm 1011 is rotatably connected to the first rotating shaft 1012. In this way, rotation of the first swing arm 1011 relative to the base 104 is implemented through rotation of the first swing arm 1011 around the first rotating shaft 1012.

In this application, the second rotation assembly 102 and the first rotation assembly 101 may be symmetrically disposed relative to the base 104. As shown in FIG. 6a and FIG. 6b, the second rotation assembly 102 may include a second swing arm 1021. The second swing arm 1021 is rotatably connected to the base 104. In addition, the second rotation assembly 102 may further include a second rotating shaft 1022. The second rotating shaft 1022 may be mounted on the base 104. The second swing arm 1021 may rotate around the second rotating shaft 1022. This implements rotation of the second swing arm 1021 relative to the base 104.

It should be noted that, in this application, an axis of the first rotating shaft 1012 and an axis of the second rotating shaft 1022 may be disposed in parallel. In this way, an extension direction of the axis of the first rotating shaft 1012 is the same as an extension direction of the axis of the second rotating shaft 1022.

Still refer to FIG. 5 and FIG. 6b. In this application, the damping assembly 103 may include friction assemblies 1031. The friction assembly 1031 may be located between the first rotation assembly 101 and the second rotation assembly 102. The friction assembly 1031 may include an intermediate shaft 10311 and a gear member 10312. The gear member 10312 may be sleeved on the intermediate shaft 10311, and the gear member 10312 is rotatably connected to the intermediate shaft 10311.

Figure 7A:
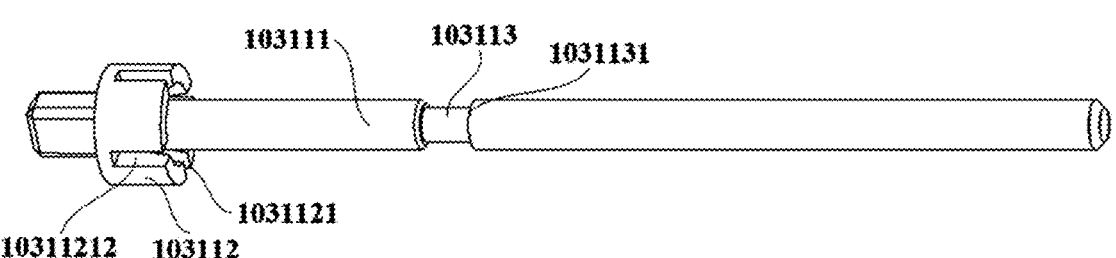
FIG. 7a is a diagram of a three-dimensional structure of an intermediate shaft according to an embodiment of this application.

When the intermediate shaft 10311 is specifically disposed, refer to FIG. 7*a*. FIG. 7*a* is a diagram of a three-dimensional structure of the intermediate shaft 10311 according to an embodiment of this application. The intermediate shaft 10311 may include a shaft body 103111 and a mounting part 103112. The shaft body 103111 is connected to the base 104 shown in FIG. 2*b*. An extension direction of an axis of the shaft body 103111 may be the same as the extension direction of the axis of the first rotating shaft 1012 and the extension direction of the axis of the second rotating shaft 1022.

Figure 7B:
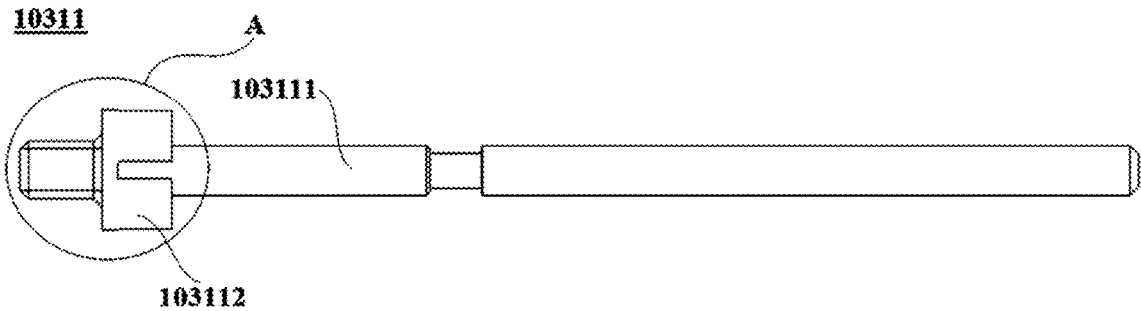
Figure 7C:
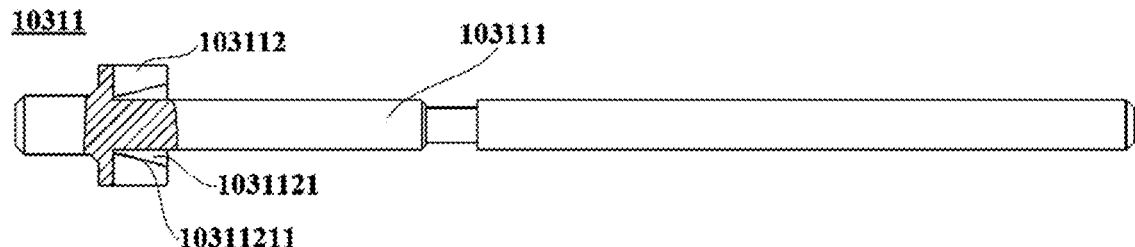
FIG. 7c is a sectional view of a partial structure of the intermediate shaft shown in FIG. 7b.

The mounting part 103112 is disposed on the shaft body 103111, and the mounting part 103112 may be disposed around a circumferential direction of the shaft body 103111. Refer to FIG. 7*b*. FIG. 7*b* is a front view of the intermediate shaft 10311 shown in FIG. 7*a*. In addition, refer to FIG. 7*c*. FIG. 7*c* is a sectional view of a partial structure of the intermediate shaft 10311 shown in FIG. 7*b*, and may be used to display a cross-sectional structure at a place A in FIG. 7*b*. As shown in FIG. 7*c*, the mounting part 103112 has a tapered groove 1031121. An opening of the tapered groove 1031121 is provided facing the gear member 10312. Refer to FIG. 5 and FIG. 7*c* together. In a direction facing the gear member 10312, a circumferential radius of the tapered groove 1031121 gradually increases. In addition, a center line of the tapered groove 1031121 coincides with the axis of the shaft body 103111. A shape of the mounting part 103112 is not specifically limited in this application. For example, the shape may be a cylindrical shape shown in FIG. 7*a* to FIG. 7*c*, or may be some other possible shapes. An included angle between a groove face 10311211 of the tapered groove 1031121 and the center line of the tapered groove 1031121 is not specifically limited in this application. A person skilled in the art may adjust the included angle through simulation, experimentation, and the like based on a specific overall design requirement. In some possible embodiments, the included angle between the groove face 10311211 of the tapered groove 1031121 and the center line of the tapered groove 1031121 may be 45° or 60°.

Figure 8:
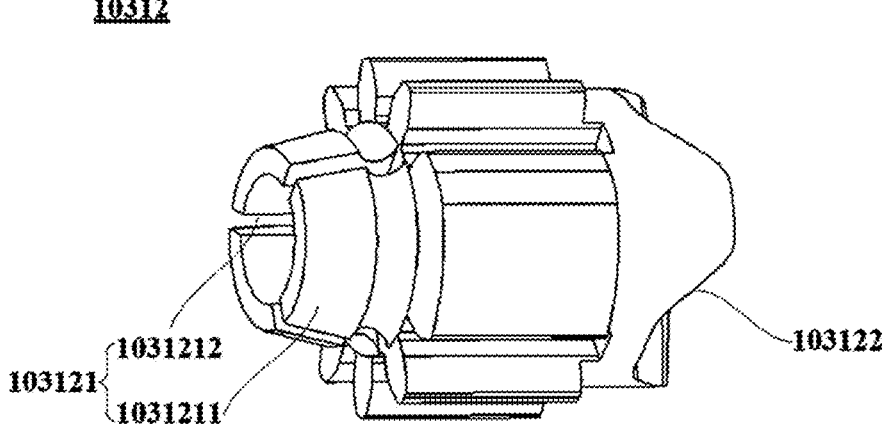
FIG. 8 is a diagram of a structure of a gear member according to an embodiment of this application.

In this application, when the gear member 10312 is specifically disposed, refer to FIG. 8. FIG. 8 is a diagram of a structure of the gear member 10312 according to an embodiment of this application. The gear member 10312 may include an insertion part 103121, and the insertion part 103121 has a tapered face 1031211. Refer to FIG. 5 and FIG. 8 together. In a direction away from the mounting part 103112, a circumferential radius of the tapered face 1031211 gradually increases.

Figure 9A:
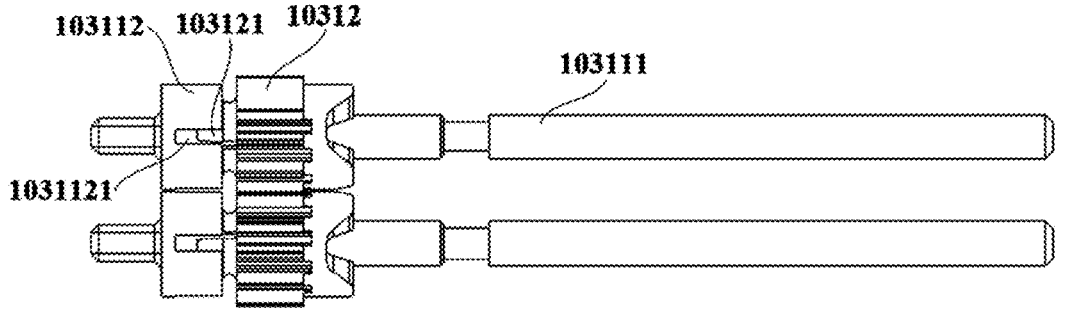
FIG. 9a is a diagram of a structure in which a gear member and an intermediate shaft are in an assembled state according to an embodiment of this application.
Figure 9B:
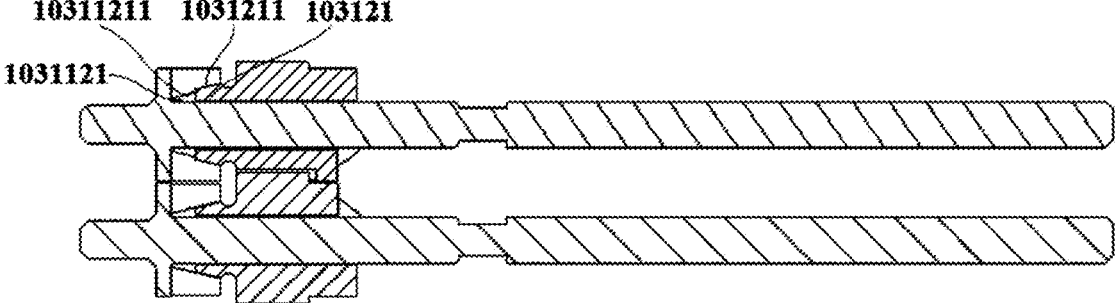

Refer to FIG. 9*a*. FIG. 9*a* is a diagram of a structure in which the gear member 10312 and the intermediate shaft 10311 are in an assembled state according to an embodiment of this application. The insertion part 103121 may be inserted into the tapered groove 1031121 of the mounting part 103112 of the intermediate shaft 10311. In addition, refer to FIG. 9*b*. FIG. 9*b* is a cross-sectional view of the structure shown in FIG. 9*a*. It can be learned from FIG. 9*b* that the tapered face 1031211 of the insertion part 103121 abuts against the groove face 10311211 of the tapered groove 1031121 of the mounting part 103112. In addition, in this application, the tapered face 1031211 may be in frictional contact with the groove face 10311211 of the tapered groove 1031121.

In this application, frictional contact between two components means that, in a process in which the two components rotate relative to each other, friction force may be generated between contact faces of the two components, and the friction force may prevent the two components from continuing to move relative to each other. In view of this, in a process in which the gear member 10312 rotates around the intermediate shaft 10311, the tapered face 1031211 of the gear member 10312 may rotate relative to the groove face 10311211 of the tapered groove 1031121. As a result, friction force may be generated between the gear member 10312 and the intermediate shaft 10311. The foregoing friction force exists in the overall process in which the gear member 10312 rotates around the intermediate shaft 10311. Therefore, when the damping assembly 103 is used in the hinge mechanism 1 of the electronic device, the damping assembly 103 can provide reliable state retention force for the electronic device to hover in the corresponding state when the electronic device is in the closed state, the unfolded state, or the intermediate state. This can meet use requirements of a user on the electronic device in different rotation states, thereby improving user experience.

It may be understood that larger abutting force between the tapered face 1031211 of the gear member 10312 and the groove face 10311211 of the tapered groove 1031121 of the mounting part 103112 usually indicates larger friction force that may be generated between the tapered face 1031211 and the groove face 10311211 in a relative rotation process. In view of this, in different application scenarios, magnitude of abutting force between the tapered face 1031211 of the gear member 10312 and the groove face 10311211 of the tapered groove 1031121 of the mounting part 103112 is adjusted based on requirements on the friction force. For example, when resilience force of the flexible display of the electronic device in the bent state is large, large friction force is required to implement hover of the flexible display in different folded states. In this case, the abutting force between the tapered face 1031211 of the gear member 10312 and the groove face 10311211 of the tapered groove 1031121 of the mounting part 103112 may be increased.

In this application, there may be a plurality of manners of increasing the abutting force between the tapered face 1031211 of the gear member 10312 and the groove face 10311211 of the tapered groove 1031121 of the mounting part 103112. For example, in the intermediate shaft 10311 shown in FIG. 7*a*, a groove wall of the tapered groove 1031121 may be provided with a first notch 10311212.

A number of first notches 10311212 of the tapered groove 1031121 is not limited in this application. For example, there may be at least two, for example, two to four, first notches 10311212. In the intermediate shaft 10311 shown in FIG. 7*a*, four first notches 10311212 are disposed in the tapered groove 1031121. In this application, the number of first notches 10311212 of the tapered groove 1031121 is set to 2 to 4. This can further improve structural reliability of the mounting part 103112 when the tapered groove 1031121 can be deformed greatly. In addition, to improve uniformity of force transfer by the intermediate shaft 10311, the at least two first notches 10311212 may be arranged in a centrosymmetric manner in a circumferential direction of the tapered groove 1031121. In other words, the at least two first notches 10311212 are evenly distributed in the circumferential direction of the tapered groove 1031121. For example, when the four first notches 10311212 are disposed in the tapered groove 1031121, central angles between any two first notches 10311212 are equal in the circumferential direction of the tapered groove 1031121. In view of this, a size of the insertion part 103121 of the gear member 10312 may be increased. In this way, in a process of inserting the insertion part 103121 into the tapered groove 1031121, the opening of the tapered groove 1031121 is deformed adaptively under an action of extrusion force of the gear member 10312. This helps increase the abutting force between the groove face 10311211 of the tapered groove 1031121 and the tapered face 1031211 of the insertion part 103121, thereby increasing the friction force in the process in which the groove face 10311211 and the tapered face 1031211 rotate relative to each other.

In addition, in this application, the insertion part 103121 of the gear member 10312 may also be provided with a notch. During specific implementation, still refer to FIG. 8. For ease of distinguishing, the notch of the insertion part 103121 may be defined as a second notch 1031212. A number of second notches 1031212 of the insertion part 103121 is not limited in this application. For example, there may be at least two, for example, two to four, second notches 1031212. In the gear member 10312 shown in FIG. 8, three second notches 1031212 are disposed at the insertion part 103121. In this application, the number of second notches 1031212 of the insertion part 103121 is set to 2 to 4. This can further improve structural reliability of the insertion part 103121 when the insertion part 103121 can be deformed greatly. In addition, to improve uniformity of force transfer by the insertion part 103121, the second notches 1031212 may be arranged in the centrosymmetric manner in a circumferential direction of the insertion part 103121. In other words, the at least two second notches 1031212 are evenly distributed in the circumferential direction of the insertion part 103121. For example, when the three second notches 1031212 are disposed at the insertion part 103121, central angles between any two second notches 1031212 are equal in the circumferential direction of the insertion part 103121.

It should be noted that, in this application, only the tapered groove 1031121 may be provided with the first notches 10311212, and the insertion part 103121 is not provided with the second notches 1031212; only the insertion part 103121 is provided with the second notches 1031212, and the tapered groove 1031121 is not provided with the first notches 10311212; or the insertion part 103121 is provided with the second notches 1031212 when the tapered groove 1031121 is provided with the first notches 10311212. In this way, at least one of the insertion part 103121 and the tapered groove 1031121 that are in an insertion relationship is deformed, to increase the abutting force between the tapered face 1031211 of the insertion part 103121 and the groove face 10311211 of the tapered groove 1031121, so as to increase friction force generated in a process in which the gear member 10312 and the intermediate shaft 10311 rotate relative to each other.

Still refer to FIG. 5 and FIG. 6*b*. In this application, the damping assembly 103 may further include a damping support 1032. The damping support 1032 may be used as a locating component of the damping assembly 103 in an entire shaft of the hinge mechanism 1. Specifically, refer to FIG. 2*b*. The base 104 may include an accommodation cavity 1041. The damping support 1032 may be accommodated in the accommodation cavity 1041, and the damping support 1032 is fastened to the base 104. In addition, refer to FIG. 5 and FIG. 7*a* together. An end of the intermediate shaft 10311 may be inserted into the damping support 1032. In addition, as shown in FIG. 7*a*, a cross section the end that is of the intermediate shaft 10311 and that is configured to be inserted into the damping support 1032 may be a noncircular face, for example, may be a square face. In this way, when the intermediate shaft 10311 is inserted into the damping support 1032, the intermediate shaft 10311 can be prevented from rotating relative to the damping support 1032. This can improve reliability of rotation of the gear member 10312 relative to the intermediate shaft 10311. In addition, the intermediate shaft 10311 is inserted into the damping support 1032. This can effectively prevent the damping assembly 103 from deflecting relative to the base 104, thereby improving locating accuracy of the damping assembly 103 in the hinge mechanism 1.

The damping support 1032 is fastened to the base 104. Therefore, in view of this, it may be understood that the rotatable connection between the first swing arm 1011 and the base 104 may also be implemented through a rotatable connection between the first swing arm 1011 and the damping support 1032. Specifically, the first rotating shaft 1012 may penetrate the damping support 1032. In addition, as shown in FIG. 6*b*, the first swing arm 1011 may include a first rotation part 10111. A first avoidance opening 101111 may be disposed at the first rotation part 10111 of the first swing arm 1011. In the extension direction of the axis of the first rotating shaft 1012, the first avoidance opening 101111 may be but is not limited to being located in a middle position of the first rotation part 10111. The damping support 1032 may include a first connection part 10321. The first connection part 10321 may be inserted into the first avoidance opening 101111. In this case, the first rotating shaft 1012 may penetrate both the first rotation part 10111 and the first connection part 10321. In this way, the first rotation part 10111 is rotatably connected to the first connection part 10321, so that a structure of the hinge mechanism 1 is compact when the rotatable connection between the first swing arm 1011 and the damping support 1032 is implemented. This helps implement a miniaturization design of the hinge mechanism 1.

In this application, the second swing arm 1021 may also be rotatably connected to the damping support 1032. The second rotating shaft 1022 may penetrate the damping support 1032. In addition, the second swing arm 1021 includes a second rotation part 10211. A second avoidance opening 102111 may be disposed at the second rotation part 10211 of the second swing arm 1021. In the extension direction of the axis of the second rotating shaft 1022, the second avoidance opening 102111 may be but is not limited to being located in the middle position of the second rotation part 10211. The damping support 1032 may include a second connection part 10322. The second connection part 10322 may be inserted into the second avoidance opening 102111. In this case, the second rotating shaft 1022 may penetrate both the second rotation part 10211 and the second connection part 10322. In this way, the second rotation part 10211 is rotatably connected to the second connection part 10322, so that the hinge mechanism 1 has a compact structure when the rotatable connection between the second swing arm 1021 and the damping support 1032 is implemented.

It can be learned from the foregoing descriptions of the structure of the friction assembly 1031 that the friction force of the friction assembly 1031 is provided based on rotation of the gear member 10312 relative to the intermediate shaft 10311. In addition, the first rotation assembly 101 and the second rotation assembly 102 may rotate around the base 104. Therefore, in this application, the gear member 10312 may be driven, through rotation of the first rotation assembly 101 and the second rotation assembly 102, to rotate around the intermediate shaft 10311.

During specific implementation, still refer to FIG. 5 and FIG. 6*b*. It may be understood that, in this application, to enable the first rotation assembly 101 and the second rotation assembly 102 to rotate toward each other or away from each other, the damping assembly 103 may include an even number of friction assemblies 1031. For example, there may be two friction assemblies shown in FIG. 5, or may be four, six, or eight friction assemblies 1031, which may be specifically selected based on a size of the hinge mechanism 1. In addition, usually, a larger number of friction assemblies 1031 indicates larger friction force that can be provided by the damping assembly 103. Therefore, a number of friction assemblies 1031 in the damping assembly 103 may be further selected based on friction force required by the electronic device in which the damping assembly 103 is used to hover at any rotation angle.

Still refer to FIG. 5. In gear members 10312 of the even number of friction assemblies 1031, gear faces of two adjacent gear members 10312 are engaged with each other. In addition, the gear members 10312 of the even number of friction assemblies 1031 may be located between the first rotation assembly 101 and the second rotation assembly 102. Specifically, as shown in FIG. 6b, the even number of gear members 10312 may be located between the first swing arm 1011 and the second swing arm 1021. A first gear face 101112 may be disposed at an end that is of the first swing arm 1011 and that faces the even number of gear members 10312. For example, the first gear face 101112 may be disposed at the first rotation part 10111 of the first swing arm 1011. If a rotation axis of the first gear face 101112 coincides with a rotation axis of the first rotation part 10111, both the first gear face 101112 and the first rotation part 10111 rotate around the first rotating shaft 1012.

In another possible embodiment of this application, the first swing arm 1011 may further include a first drive part (not shown in FIG. 5). The first drive part is detachably connected to the first rotation part 10111. In addition, in a rotation direction of the first swing arm 1011, the first drive part and the first rotation part 10111 are relatively fastened. In this way, the first drive part can rotate synchronously around the base 104 along with the first rotation part 10111. A manner of connecting the first drive part to the first rotation part 10111 is not limited in this application. For example, the first drive part and the first rotation part 10111 may be connected by using a locating pin. In view of this, the first gear face 101112 may be further disposed at the first drive part.

In addition, a second gear face 102112 may be disposed at an end that is of the second swing arm 1021 and that faces the even number of gear members 10312. For example, the second gear face 102112 may be disposed at the second rotation part 10211 of the second swing arm 1021. If a rotation axis of the second gear face 102112 coincides with a rotation axis of the second rotation part 10211, both the second gear face 102112 and the second rotation part 10211 rotate around the second rotating shaft 1022.

In another possible embodiment of this application, the second swing arm 1021 may further include a second drive part (not shown in FIG. 5). The second drive part is detachably connected to the second rotation part 10211. In addition, in a rotation direction of the second swing arm 1021, the second drive part and the second rotation part 10211 are relatively fastened. In this way, the second drive part can rotate synchronously around the base 104 along with the second rotation part 10211. A manner of connecting the second drive part to the second rotation part 10211 is not limited in this application. For example, the second drive part and the second rotation part 10211 may be connected by using a locating pin. In view of this, the second gear face 102112 may be further disposed at the second drive part.

Still refer to FIG. 5. If the gear faces of the two adjacent gear members 10312 are engaged with each other, the first gear face 101112 is in transmission connection to the second gear face 102112 by using the gear members 10312 of the even number of friction assemblies 1031. In this case, the first gear face 101112 may be engaged with a gear face of an adjacent gear member 10312, and the second gear face 102112 may be engaged with a gear face of an adjacent gear member 10312. In this way, in a process in which the first swing arm 1011 and the second swing arm 1021 rotate around the damping support 1032, each gear member 10312 may be driven to rotate around an intermediate shaft 10311 corresponding to the gear member 10312.

It should be noted that, in this application, the first swing arm 1011 and the second swing arm 1021 may be used as drive components for the gear member 10312 to rotate around the intermediate shaft 10311. In addition, the first swing arm 1011 is in transmission connection to the second swing arm 1021 by using the gear members 10312 of the even number of friction assemblies 1031. In this way, when the first swing arm 1011 and the second swing arm 1021 drive the gear members 10312 to rotate, the first swing arm 1011 and the second swing arm 1021 can further rotate synchronously toward each other or away from each other. Then, the first rotation assembly 101 and the second rotation assembly 102 can rotate synchronously toward each other or away from each other. In this case, when the hinge mechanism 1 is used in the electronic device, a hover function of the electronic device in any rotation state can be implemented, and motion stability of the electronic device can be effectively improved. As a result, structural reliability of the flexible display of the electronic device can be improved, to prolong a service life of the flexible display.

In this application, to enable the insertion part 103121 of the gear member 10312 to be always inserted into the tapered groove 1031121 of the mounting part 103112, so that the tapered face 1031211 and the groove face 10311211 of the tapered groove 1031121 are always in a pressing state, the damping assembly 103 may further include an elastic module 1033. Under an action of elastic force of the elastic module 1033, the gear member 10312 may be pressed toward the mounting part 103112. During specific implementation, still refer to FIG. 5 and FIG. 6b. The gear member 10312 is located between the mounting part 103112 and the elastic module 1033. In an extension direction of an axis of the intermediate shaft 10311, the elastic module 1033 presses the gear member 10312 toward the mounting part 103112. In this way, the tapered face 1031211 can abut against the groove face 10311211 of the tapered groove 1031121.

In this application, a specific type of the elastic module 1033 is not limited. For example, the elastic module 1033 may be a spring, and the elastic module 1033 may include a plurality of springs. In this way, at least one spring may be sleeved on each intermediate shaft 10311.

In addition, still refer to FIG. 5 and FIG. 6b. The damping assembly 103 provided in this embodiment of this application may further include a first conjoined cam 1034. The first conjoined cam 1034 may be located between the elastic module 1033 and the first swing arm 1011. In addition, the first conjoined cam 1034 is also located between the elastic module 1033 and the second swing arm 1021, and the first conjoined cam 1034 may be sleeved on the first rotating shaft 1012 and the second rotating shaft 1022.

As shown in FIG. 6b, an end that is of the first swing arm 1011 and that faces the first conjoined cam 1034 has a first cam face 101113. For example, the first cam face 101113 may be disposed at an end of the first connection part 10321. An end that is of the second swing arm 1021 and that faces the first conjoined cam 1034 has a second cam face 102113. For example, the second cam face 102113 may be disposed at an end of the second connection part 10322. In addition, an end that is of the first conjoined cam 1034 and that faces the first swing arm 1011 may have a third cam face 10341. An end that is of the first conjoined cam 1034 and that faces the second swing arm 1021 may have a fourth cam face 10342. In this case, the first cam face 101113 may abut against the third cam face 10341 under the action of the elastic force of the elastic module 1033 in the extension direction of the axis of the first rotating shaft 1012. The second cam face 102113 may abut against the fourth cam face 10342 under the action of the elastic force of the elastic module 1033 in the extension direction of the axis of the second rotating shaft 1022.

In this application, in an extension direction of an axis of each corresponding shaft, a cam face may include a protrusion part and a recess part. A slope exists in a process of transition from the protrusion part to the recess part or from the recess part to the protrusion part. It may be understood from the foregoing descriptions that the two end cams in the embodiment shown in FIG. 4 may provide the damping force when the slopes are in contact that, in a process in which the first swing arm 1011 and the second swing arm 1021 rotate around the corresponding rotating shafts, corresponding damping force may be generated when slopes of two cam faces that abut against each other are in contact. Due to existence of the damping force, a self-unfolding function of the electronic device in an end phase of the unfolded state or a self-closing function of the electronic device in an end phase of the closed state can be implemented. In addition, under an action of the damping force, the user can have an obvious frustration hand feeling in a process of opening or closing the electronic device, to improve user experience.

It may be understood that, in this application, the elastic module 1033 may be further sleeved on the first rotating shaft 1012 and the second rotating shaft 1022. This can increase elastic force applied by the elastic module 1033 to the first conjoined cam 1034. As a result, the first cam face 101113 reliably abuts against the third cam face 10341, and the second cam face 102113 reliably abuts against the fourth cam face 10342.

Still refer to FIG. 6*b*. A fifth cam face 103122 may be disposed at an end that is of each gear member 10312 and that faces the first conjoined cam 1034. A sixth cam face 10343 may be disposed at an end that is of the first conjoined cam 1034 and that faces each gear member 10312. The fifth cam face 103122 may abut against the sixth cam face 10343 under the action of the elastic force of the elastic module 1033 in the extension direction of the axis of the intermediate shaft 10311. In this way, damping force can be generated between the gear member 10312 and the first conjoined cam 1034 in a process in which the first swing arm 1011 and the second swing arm 1021 drive the gear member 10312 to rotate around the intermediate shaft 10311. As a result, the hinge mechanism 1 can provide larger damping force. This can improve stability of retaining, in the unfolded state, the closed state, or the intermediate state, the electronic device in which the hinge mechanism 1 is used. In addition, this can further effectively improve a touch feeling of the user in the process of opening or closing the electronic device, thereby improving user experience.

It can be learned from the foregoing descriptions that the damping force provided by the hinge mechanism 1 may be increased by increasing a number of cam faces abutting against each other. In view of this, still refer to FIG. 5 and FIG. 6*b*. The damping assembly 103 may further include a second conjoined cam 1035. The second conjoined cam

1035 is sleeved on the first rotating shaft 1012 and the second rotating shaft 1022. The first swing arm 1011 is located between the first conjoined cam 1034 and the second conjoined cam 1035. The second swing arm 1021 is located between the first conjoined cam 1034 and the second conjoined cam 1035. In addition, a seventh cam face 101114 is disposed at an end that is of the first swing arm 1011 and that faces the second conjoined cam 1035. For example, the seventh cam face 101114 may be disposed at the end of the first connection part 10321. An eighth cam face 102114 is disposed at an end that is of the second swing arm 1021 and that faces the second conjoined cam 1035. For example, the eighth cam face 102114 may be disposed at the end of the second connection part 10322. An end that is of the second conjoined cam 1035 and that faces the first swing arm 1011 has a ninth cam face 10351. An end that is of the second conjoined cam 1035 and that faces the second swing arm 1021 has a tenth cam face 10352. The seventh cam face 101114 abuts against the ninth cam face 10351 under the action of the elastic force of the elastic module 1033 in the extension direction of the axis of the first rotating shaft 1012. The eighth cam face 102114 abuts against the tenth cam face 10352 under the action of the elastic force of the elastic module 1033 in the extension direction of the axis of the second rotating shaft 1022. In this way, the hinge mechanism 1 can provide the larger damping force.

It may be understood that a portion that is of the second conjoined cam 1035 and at which the ninth cam face 10351 is disposed may be sleeved on the first rotating shaft 1012. In addition, still refer to FIG. 5 and FIG. 6*b*. A first stop part 10121 may be further disposed on the first rotating shaft 1012. The portion that is of the second conjoined cam 1035 and that is sleeved on the first rotating shaft 1012 may be located between the first stop part 10121 and the first swing arm 1011. In the extension direction of the axis of the first rotating shaft 1012, the second conjoined cam 1035 may abut against the first stop part 10121. Similarly, a portion that is of the second conjoined cam 1035 and at which the tenth cam face 10352 is disposed may be sleeved on the second rotating shaft 1022. A second stop part 10221 may be further disposed on the second rotating shaft 1022. The portion that is of the second conjoined cam 1035 and that is sleeved on the second rotating shaft 1022 may be located between the second stop part 10221 and the second swing arm 1021. In the extension direction of the axis of the second rotating shaft 1022, the second conjoined cam 1035 may abut against the second stop part 10221. In this case, the first stop part 10121 and the second stop part 10221 can limit movement of the second conjoined cam 1035 in the extension direction of the axis of the first rotating shaft 1012 and the extension direction of the axis of the second rotating shaft 1022. This can prevent the second conjoined cam 1035 from falling off from the first rotating shaft 1012 and the second rotating shaft 1022, thereby improving structural reliability of the hinge mechanism 1.

In this application, to enable the elastic module 1033 to press the first conjoined cam 1034, the first swing arm 1011, and the second conjoined cam 1035 tightly, and press the first conjoined cam 1034, the second swing arm 1021, and the second conjoined cam 1035 tightly, the damping assembly 103 may further include a first limiting member 1036. Still refer to FIG. 5 and FIG. 6*b*. The elastic module 1033 may be located between the first conjoined cam 1034 and the first limiting member 1036. One end of the first limiting member 1036 may be clamped to the first rotating shaft 1012 for limiting, and the other end of the first limiting member 1036 may be clamped to the second rotating shaft 1022 for limiting. In addition, in the extension direction of the axis of the first rotating shaft 1012, the elastic module 1033 may abut against the first limiting member 1036. This can prevent structures disposed on the first rotating shaft 1012 and the second rotating shaft 1022 from falling off from the corresponding rotating shafts, thereby improving structural reliability of the damping assembly 103.

Still refer to FIG. 6*b*. To clamp the first limiting member 1036 to the first rotating shaft 1012 for limiting, a first contraction part 10122 may be disposed on the first rotating shaft 1012. In this case, a first bayonet 10361 may be disposed at the end of the first limiting member 1036, and the first bayonet 10361 is clamped at the first contraction part 10122. Similarly, a second contraction part 10222 may be disposed on the second rotating shaft 1022. A second bayonet 10362 may be disposed at the other end of the first limiting member 1036, and the second bayonet 10362 may be clamped at the second contraction part 10222. In this application, a contraction part is a portion that is of a shaft and whose diameter decreases.

In addition, in the damping assembly 103 shown in FIG. 5 and FIG. 6*b*, the cam faces are disposed at both the two ends of the first swing arm 1011 in the extension direction of the axis of the first rotating shaft 1012, in the extension direction of the axis of the second rotating shaft 1022, the cam faces are disposed at both the two ends of the second swing arm 1021, and the cam face is disposed only at the end that is of the gear member 10312 and that faces the first conjoined cam 1034. In view of this, to improve reliability of the fifth cam face 103122 of the gear member 10312 abutting against the sixth cam face 10343 of the first conjoined cam 1034, the damping assembly 103 may further include a second limiting member 1037. The second limiting member 1037 is located between the first conjoined cam 1034 and the elastic module 1033, and the second limiting member 1037 is clamped to each intermediate shaft 10311 for limiting. The first conjoined cam 1034 abuts against the second limiting member 1037. This limits movement of the first conjoined cam 1034 in an axial direction of the intermediate shaft 10311. As a result, the fifth cam face 103122 abuts against the sixth cam face 10343 under an action of abutting force between the first conjoined cam 1034 and the second limiting member 1037 in the extension direction of the axis of each intermediate shaft 10311.

Still refer to FIG. 6*b*. To clamp the second limiting member 1037 to each intermediate shaft 10311 for limiting, a third bayonet 10371 may be disposed on the second limiting member 1037, and a third contraction part 103113 shown in FIG. 7*a* may be disposed on the shaft body 103111 of each intermediate shaft 10311. In this case, the third bayonet 10371 may be clamped at the third contraction part 103113. In addition, it may be understood that, in the extension direction of the axis of the intermediate shaft 10311, the second limiting member 1037 may move in the third contraction part 103113, so that the first conjoined cam 1034 can move in the extension direction of the axis of the intermediate shaft 10311 in a process in which the gear member 10312 rotates around the intermediate shaft 10311.

Still refer to FIG. 7*a*. When the third contraction part 103113 is specifically disposed, the third contraction part 103113 includes a shoulder 1031131. Refer to FIG. 6*b* and FIG. 7*a* together. In the extension direction of the axis of each intermediate shaft 10311, the second limiting member 1037 is located between the first conjoined cam 1034 and the shoulder 1031131. In addition, the second limiting member 1037 abuts against the shoulder 1031131 when the top of a protrusion part of the fifth cam face 103122 of the gear member 10312 is flush with the top of a protrusion part of the sixth cam face 10343 of the first conjoined cam 1034. In view of this, a maximum distance at which the second limiting member 1037 moves relative to the gear member 10312 in the third contraction part 103113 can be limited. In addition, the first conjoined cam 1034 always abuts against the second limiting member 1037. Therefore, a structure of the third contraction part 103113 is disposed to also limit relative positions of the first conjoined cam 1034 and the gear member 10312. This can improve reliability of the first conjoined cam 1034 abutting against the cam face of the gear member 10312, and improve reliability of inserting the insertion part 103121 of the gear member 10312 into the tapered groove 1031121 of the mounting part 103112.

It should be noted that implementation of the first conjoined cam 1034 abutting against the second limiting member 1037 mentioned in the foregoing descriptions in this application includes the following two cases: When the second limiting member 1037 moves in the third contraction part 103113 in the extension direction of the axis of the intermediate shaft 10311, the first conjoined cam 1034 abuts against the second limiting member 1037 under the action of the elastic force of the elastic module 1033. In addition, when the second limiting member 1037 abuts against the shoulder 1031131, the first conjoined cam 1034 may abut against the second limiting member 1037 under the action of the elastic force of the elastic module 1033 and an action of abutting force between the second limiting member 1037 and the shoulder 1031131. In either case, the first conjoined cam 1034 and the second limiting member 1037 are always in the pressing state, and the fifth cam face 103122 can always abut against the sixth cam face 10343 under the action of the abutting force between the first conjoined cam 1034 and the second limiting member 1037.

In addition, as shown in FIG. 5 and FIG. 6*b*, an accommodation slot 10344 may be further disposed on a side that is of the first conjoined cam 1034 and that faces the second limiting member 1037. In this case, at least a portion of the second limiting member 1037 can be accommodated in the accommodation slot 10344. In this way, a layout of the first conjoined cam 1034 and the second limiting member 1037 can be compact, and a size of the first conjoined cam 1034 in the extension direction of the axis of the intermediate shaft 10311 can be effectively reduced. This helps reduce a size of the hinge mechanism 1, thereby implementing the miniaturization design of the hinge mechanism 1.

Still refer to FIG. 5 and FIG. 6*b*. In this embodiment of this application, the hinge mechanism 1 may further include a fixing mount 1038. The fixing mount 1038 may be located between the elastic module 1033 and the first limiting member 1036. In addition, the elastic module 1033 presses the fixing mount 1038 toward the first limiting member 1036. In addition, the first rotating shaft 1012, the second rotating shaft 1022, and each intermediate shaft 10311 may all penetrate the fixing mount 1038. In this way, the fixing mount 1038 can support the first rotating shaft 1012, the second rotating shaft 1022, and each intermediate shaft 10311, to improve structural stability of the hinge mechanism 1.

Figure 10:
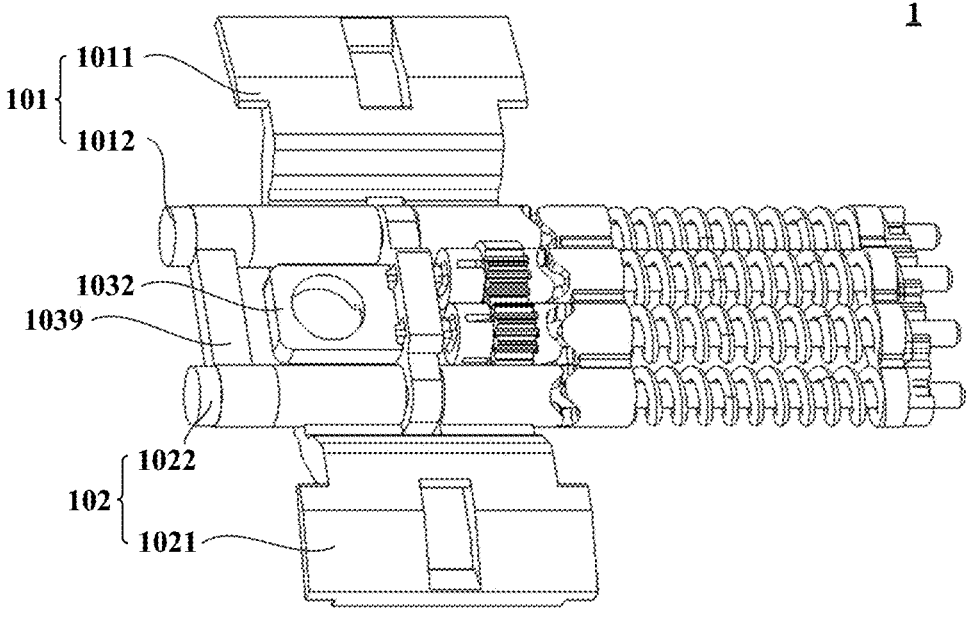
FIG. 10 is a diagram of another structure of a damping assembly according to an embodiment of this application.

Refer to FIG. 10. FIG. 10 is a diagram of another structure of a hinge mechanism 1 according to an embodiment of this application. Different from that in the hinge mechanism 1 shown in FIG. 5 and FIG. 6*b*, the second conjoined cam 1035 is replaced with a connector 1039 in a damping assembly 103 in FIG. 10. Specifically, a first swing arm 1011 is located between the connector 1039 and a first conjoined cam 1034. A second swing arm 1021 is located between the connector 1039 and a first conjoined cam 1034. One end of the connector 1039 is sleeved on a first rotating shaft 1012, and the other end of the connector 1039 is sleeved on a second rotating shaft 1022. The connector 1039 may be configured to support the first rotating shaft 1012 and the second rotating shaft 1022.

Figure 11:
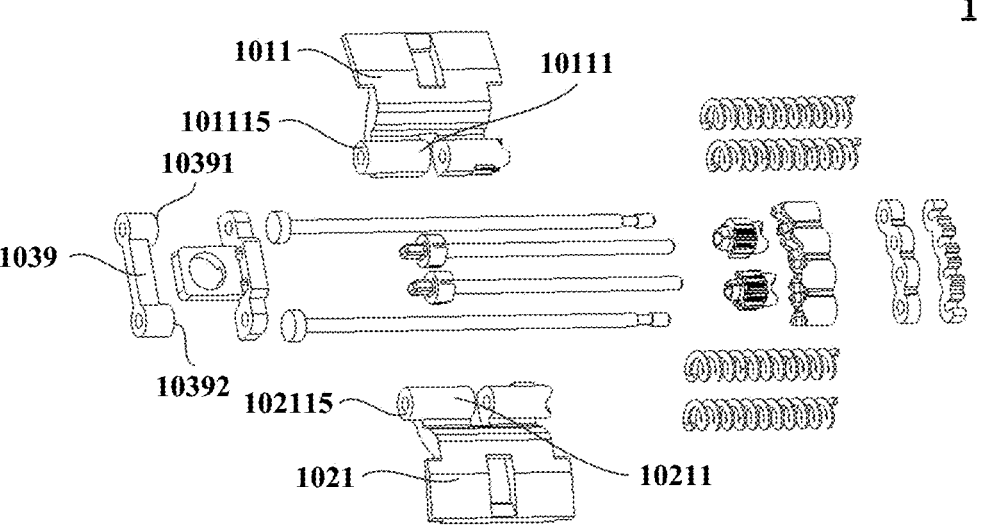
FIG. 11 is an exploded view of the damping assembly shown in FIG. 10.

In addition, refer to FIG. 11. FIG. 11 is an exploded view of the hinge mechanism 1 shown in FIG. 10. A first plane 101115 is disposed at an end that is of the first swing arm 1011 and that faces the connector 1039. For example, the first plane 101115 may be disposed at an end of a first rotation part 10111. A second plane 102115 is disposed at an end that is of the second swing arm 1021 and that faces the connector 1039. For example, the second plane 102115 may be disposed at an end of a second rotation part 10211. A third plane 10391 is disposed at an end that is of the connector 1039 and that faces the first swing arm 1011. A fourth plane 10392 is disposed at an end that is of the connector 1039 and that faces the second swing arm 1021. In this case, the first plane 101115 abuts against the third plane 10391, and the second plane 102115 abuts against the fourth plane 10392. In this way, in a process in which the first swing arm 1011 and the second swing arm 1021 rotate relative to a damping support 1032, between the first swing arm 1011 and the connector 1039 and between the second swing arm 1021 and the connector 1039, friction force generated through relative rotation between the planes abutting against each other can also be used as state retention force for output. The friction force helps improve stability of hover, in any rotation state, of an electronic device in which the hinge mechanism is used.

In this embodiment, the first swing arm 1011, the second swing arm 1021, and a gear member 10312 are all provided with only cam faces abutting against the first conjoined cam 1034. Therefore, the first conjoined cam 1034 can always retain stable contact with the first swing arm 1011, the second swing arm 1021, and the gear member 10312 under an action of elastic force of an elastic component. Therefore, the second limiting member 1037 shown in FIG. 6b may not be disposed on the damping assembly 103, and the third contraction part 103113 is not disposed on an intermediate shaft 10311 either. Certainly, to improve reliability of the first conjoined cam 1034 abutting against the first swing arm 1011, the second swing arm 1021, and the gear member 10312, the second limiting member 1037 may alternatively be retained. In addition, another structure of the hinge mechanism 1 shown in FIG. 10 and FIG. 11 may be disposed with reference to the hinge mechanism 1 shown in FIG. 5 and FIG. 6b. Details are not described herein again.

In this application, some hinge mechanisms of other possible structures may be further obtained through variation based on the structure of the hinge mechanism described above. It should be understood that these hinge mechanisms fall within the protection scope of this application. These hinge mechanisms are not described one by one herein. For example, on a basis of the hinge mechanism 1 shown in FIG. 5 and FIG. 6b, in the extension direction of the axis of the first rotating shaft 1012 and the extension direction of the axis of the second rotating shaft 1022, structures such as the friction assemblies 1031, the first conjoined cam 1034, the elastic module 1033, and the second limiting member 1037 may be symmetrically disposed. In this case, the damping support 1032 may be omitted. In addition, two symmetrically disposed friction assemblies 1031 may share an intermediate shaft 10311. In this case, two mounting parts 103112 for mounting the gear members 10312 may be disposed on each intermediate shaft 10311. In this way, the structure of the hinge mechanism 1 is simple.

It can be learned from the foregoing descriptions of the hinge mechanism 1 provided in embodiments of this application that, in the process in which the gear member 10312 rotates around the intermediate shaft 10311, friction force can be generated through relative motion between the tapered face 1031211 of the insertion part 103121 and the groove face 10311211 of the tapered groove 1031121 of the mounting part 103112, and the friction force can be used as a state retention force for the electronic device to hover at the any rotation angle. The damping force provided by the hinge mechanism 1 is generated by using the cam faces abutting against each other. In this case, structures that generate the friction force are independent of structures that generate the damping force. This can help improve structural reliability of the hinge mechanism 1, and prolong a wearing life of the hinge mechanism 1. In addition, in the overall process in which the first swing arm 1011 and the second swing arm 1021 rotate around the corresponding rotating shafts, the friction force generated when the gear member 10312 rotates around the intermediate shaft 10311 exists. Therefore, the friction force can provide, for the electronic device, sufficient state retention force required for stably retaining the electronic device in the unfolded state, the closed state, or the intermediate state. This implements hover of the electronic device in any state, thereby improving user experience.

In addition, in the damping assembly 103 provided in this application, both the friction force generated when the gear member 10312 rotates around the intermediate shaft 10311 and the damping force generated by using the cam faces abutting against each other exist. This can help increase the damping force provided by the entire damping assembly 103. As a result, the electronic device in which the damping assembly 103 is used can stably hover in a corresponding rotation state. In addition, because the foregoing two portions of force are decoupled from each other, the two portions of force can exist independently. As a result, when one portion of force fails to function, an effect of the electronic device can be achieved under an action of the other portion of force. For example, when the friction assembly 1031 is worn out, the damping force generated by the cam faces abutting against each other can also provide specific state retention force for the electronic device, to implement the hover function of the electronic device in the rotation state. For another example, when the cam faces abutting against each other are worn out, because the friction force exists, the user can also have an obvious damping hand feeling in the process in which the user opens or closes the electronic device.

The hinge mechanism 1 provided in the foregoing embodiments of this application may be applied to the electronic device shown in FIG. 1 and FIG. 2a. In addition, the hinge mechanism 1 may further include a first housing fixing mount and a second housing fixing mount. The first housing fixing mount and the first rotation assembly 101 are located on a same side of the base 104. The second housing fixing mount and the second rotation assembly 102 are located on a same side of the base 104. The first swing arm 1011 may be slidably connected to the first housing fixing mount. The second swing arm 1021 may be slidably connected to the second housing fixing mount. The first swing arm 1011 and the second swing arm 1021 may be slidably connected to the housing fixing mounts on corresponding sides in a plurality of manners. For example, sliding blocks may be disposed on the first swing arm 1011 and the second swing arm 1021. In addition, sliding slots are disposed on the corresponding housing fixing mounts. In this way, the slidable connections between the corresponding swing arms and the housing fixing mounts can be implemented through sliding of the sliding blocks along the sliding slots. To improve reliability of the connections between the swing arms and the housing fixing mounts on the corresponding sides, the sliding block may be further clamped in the sliding slots. This prevents the sliding blocks from falling off in a process of sliding along the sliding slots.

In addition, when the hinge mechanism 1 is used in the electronic device, the first housing fixing mount may be fastened to the first housing 2, and the second housing fixing mount may be fastened to the second housing 3. It can be learned from the foregoing descriptions of the hinge mechanism 1 provided in this application that the damping assembly 103 in the hinge mechanism 1 can provide the large friction force. The friction force can be transferred to a housing on a corresponding side through the first rotation assembly 101 and the second rotation assembly 102. In this way, the electronic device can be stably retained in the unfolded state shown in FIG. 2*a*, the closed state shown in FIG. 1, or the intermediate state between the unfolded state and the closed state. This helps improve user experience. In addition, due to existence of the damping force generated by the cam faces abutting against each other in the hinge mechanism 1, the self-unfolding function of the electronic device in the end phase of the unfolded state or the self-closing function of the electronic device in the end phase of the closed state can be implemented. In addition, under the action of the damping force, the user can have the obvious frustration hand feeling in the process of opening or closing the electronic device, to improve user experience.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A hinge mechanism, comprising:
a base with a first side and a second side opposite from the first side;
a first rotation assembly disposed on the first side of the base and comprised of a first swing arm, the first swing arm rotatably connected to the base;
a second rotation assembly disposed on the second side of the base and comprised of a second swing arm, the second swing arm rotatably connected to the base; and
a damping assembly, comprising:
an elastic module; and
an even number of friction assemblies, each friction assembly comprising:
a gear member comprising an insertion part with a tapered face, and
an intermediate shaft comprising a shaft body and a mounting part defining a tapered groove,
wherein the shaft body is connected to the base, the mounting part is disposed on the shaft body, and an opening of the tapered groove is provided facing the gear member; and
wherein the gear member is rotatably connected to the intermediate shaft, the insertion part is inserted into the tapered groove, and the tapered face abuts against a groove face of the tapered groove under an action of elastic force of the elastic module in an extension direction of an axis of the intermediate shaft; and
wherein gear members of the even number of friction assemblies are located between the first rotation assembly and the second rotation assembly, and gear faces of two adjacent gear members are engaged with each other; and
wherein a first gear face is disposed at an end that is of the first swing arm and that faces the gear members of the even number of friction assemblies, a second gear face is disposed at an end that is of the second swing arm and that faces the gear members of the even number of friction assemblies, the first gear face is engaged with a gear face of an adjacent gear member, and the second gear face is engaged with a gear face of an adjacent gear member.

2. The hinge mechanism according to claim 1, wherein a groove wall of each tapered groove defines at least two first notches, and the at least two first notches are arranged centrosymmetrically in a circumferential direction of the tapered groove.

3. The hinge mechanism according to claim 1, wherein each insertion part defines at least two second notches, and the at least two second notches are arranged centrosymmetrically in a circumferential direction of the insertion part.

4. The hinge mechanism according to claim 1, wherein the base defines an accommodation cavity, the damping assembly further comprises a damping support, the damping assembly is accommodated in the accommodation cavity, and the damping support is fastened to the base; and each shaft body is inserted into the damping support.

5. The hinge mechanism according to claim 4, wherein:
the first rotation assembly further comprises a first rotating shaft, the first rotating shaft penetrates the damping support, and the first swing arm is rotatably connected to the first rotating shaft; and
the second rotation assembly further comprises a second rotating shaft, the second rotating shaft penetrates the damping support, and the second swing arm is rotatably connected to the second rotating shaft.

6. The hinge mechanism according to claim 5, wherein:
the damping assembly further comprises a first conjoined cam, the first conjoined cam is sleeved on the first rotating shaft and the second rotating shaft, the first conjoined cam is located between the elastic module, the first swing arm, and the second swing arm;
an end of the first swing arm and that faces the first conjoined cam has a first cam face, and an end of the second swing arm and that faces the first conjoined cam has a second cam face;
an end of the first conjoined cam that faces the first swing arm has a third cam face, and an end of the first conjoined cam that faces the second swing arm has a fourth cam face;
the first cam face abuts against the third cam face under the action of the elastic force of the elastic module in an extension direction of an axis of the first rotating shaft; and
the second cam face abuts against the fourth cam face under the action of the elastic force of the elastic module in an extension direction of an axis of the second rotating shaft.

7. The hinge mechanism according to claim 6, wherein:
the damping assembly further comprises a first limiting member, the elastic module is located between the first conjoined cam and the first limiting member, one end of the first limiting member is clamped to the first rotating shaft for limiting, and the other end of the first limiting member is clamped to the second rotating shaft for limiting; and the elastic module abuts against the first limiting member in the extension direction of the axis of the first rotating shaft.

8. The hinge mechanism according to claim 7, further comprising:

a first contraction part disposed on the first rotating shaft;

a second contraction part is disposed on the second rotating shaft; and a first bayonet and a second bayonet disposed on the first limiting member, wherein the first bayonet is clamped at the first contraction part, and the second bayonet is clamped at the second contraction part.

9. The hinge mechanism according to claim 6, wherein a fifth cam face is disposed at an end of each gear member and that faces the first conjoined cam, a sixth cam face is disposed at an end of the first conjoined cam and that faces each gear member, and the fifth cam face abuts against the sixth cam face under the action of the elastic force of the elastic module in the extension direction of the axis of the intermediate shaft.

10. The hinge mechanism according to claim 9, wherein:

the damping assembly further comprises a second limiting member, the second limiting member is located between the first conjoined cam and the elastic module, the second limiting member is clamped to each intermediate shaft for limiting, and the first conjoined cam abuts against the second limiting member; and the fifth cam face abuts against the sixth cam face under an action of abutting force between the first conjoined cam and the second limiting member in the extension direction of the axis of each intermediate shaft.

11. The hinge mechanism according to claim 10, further comprising:

a third contraction part disposed on the shaft body of each intermediate shaft, the third contraction part comprising a shoulder, and the second limiting member is located between the first conjoined cam and the shoulder in the extension direction of the axis of each intermediate shaft; and the second limiting member abuts against the shoulder when a top of a protrusion part of the fifth cam face is flush with a top of a protrusion part of the sixth cam face.

12. The hinge mechanism according to claim 6, wherein:

the damping assembly further comprises a second conjoined cam, and the second conjoined cam is sleeved on the first rotating shaft and the second rotating shaft;

the first swing arm is located between the first conjoined cam and the second conjoined cam, the second swing arm is located between the first conjoined cam and the second conjoined cam, a seventh cam face is disposed at an end that is of the first swing arm and that faces the second conjoined cam, an eighth cam face is disposed at an end that is of the second swing arm and that faces the second conjoined cam, an end that is of the second conjoined cam and that faces the first swing arm has a ninth cam face, and an end that is of the second conjoined cam and that faces the second swing arm has a tenth cam face;

the seventh cam face abuts against the ninth cam face under the action of the elastic force of the elastic module in the extension direction of the axis of the first rotating shaft; and the eighth cam face abuts against the tenth cam face under the action of the elastic force of the elastic module in the extension direction of the axis of the second rotating shaft.

13. The hinge mechanism according to claim 6, wherein:

the damping assembly further comprises a connector, and the connector is sleeved on the first rotating shaft and the second rotating shaft;

the first swing arm is located between the connector and the first conjoined cam, the second swing arm is located between the connector and the first conjoined cam, a first plane is disposed at an end that is of the first swing arm and that faces the connector, a second plane is disposed at an end that is of the second swing arm and that faces the connector, an end that is of the connector and that faces the first swing arm has a third plane, and an end that is of the connector and that faces the second swing arm has a fourth plane; and the first plane abuts against the third plane under the action of the elastic force of the elastic module in the extension direction of the axis of the first rotating shaft; and the second plane abuts against the fourth plane under the action of the elastic force of the elastic module in the extension direction of the axis of the second rotating shaft.

14. The hinge mechanism according to claim 4, wherein:

the first swing arm comprises a first rotation part and defines a first avoidance opening;

the second swing arm comprises a second rotation part and defines a second avoidance opening;

the damping support comprises a first connection part and a second connection part, the first connection part is inserted into the first avoidance opening, and the first rotating shaft penetrates both the first rotation part and the first connection part; and the second connection part is inserted into the second avoidance opening, and the second rotating shaft penetrates both the second rotation part and the second connection part.

15. The hinge mechanism according to claim 14, wherein:

the first swing arm further comprises a first drive part, the first drive part is detachably connected to the first rotation part, and the first drive part and the first rotation part are relatively fastened in a rotation direction of the first swing arm;

the first gear face is disposed at the first rotation part, or the first gear face is disposed at the first drive part;

the second swing arm comprises a second drive part, the second drive part is detachably connected to the second rotation part, and the second drive part and the second rotation part are relatively fastened in a rotation direction of the second swing arm; and the second gear face is disposed at the second rotation part, or the second gear face is disposed at the second drive part.

16. An electronic device, comprising:

a hinge mechanism with a first side and a second side opposite from the first side of the hinge mechanism, the hinge mechanism comprising:

a base with a first side and a second side opposite from the first side of the base;

a first rotation assembly disposed on the first side of the base and comprised of a first swing arm, the first swing arm rotatably connected to the base;

a second rotation assembly disposed on the second side of the base and comprised of a second swing arm, the second swing arm rotatably connected to the base; and a damping assembly, comprising:

an elastic module; and an even number of friction assemblies, each friction assembly comprising:

a gear member comprising an insertion part with a tapered face, and an intermediate shaft comprising a shaft body and a mounting part defining a tapered groove, wherein the shaft body is connected to the base, the mounting part is disposed on the shaft body, and an opening of the tapered groove is provided facing the gear member; and wherein the gear member is rotatably connected to the intermediate shaft, the insertion part is inserted into the tapered groove, and the tapered face abuts against a groove face of the tapered groove under an action of elastic force of the elastic module in an extension direction of an axis of the intermediate shaft; and wherein gear members of the even number of friction assemblies are located between the first rotation assembly and the second rotation assembly, and gear faces of two adjacent gear members are engaged with each other; and wherein a first gear face is disposed at an end that is of the first swing arm and that faces the gear members of the even number of friction assemblies, a second gear face is disposed at an end that is of the second swing arm and that faces the gear members of the even number of friction assemblies, the first gear face is engaged with a gear face of an adjacent gear member, and the second gear face is engaged with a gear face of an adjacent gear member;

a first housing disposed on the first side of the hinge mechanism; and a second housing disposed on the second side of the hinge mechanism;

wherein the first swing arm is slidably connected to the first housing; and the second swing arm is slidably connected to the second housing.

17. The electronic device according to claim 16, wherein a groove wall of each tapered groove defines at least two first notches, and the at least two first notches are arranged centrosymmetrically in a circumferential direction of the tapered groove.

18. The electronic device according to claim 16, wherein each insertion part is provided with at least two second notches, and the at least two second notches are arranged centrosymmetrically in a circumferential direction of the insertion part.

19. The electronic device according to claim 16, wherein the base defines an accommodation cavity, the damping assembly further comprises a damping support, the damping assembly is accommodated in the accommodation cavity, and the damping support is fastened to the base; and each shaft body is inserted into the damping support.

20. The electronic device according to claim 19, wherein:

the first rotation assembly further comprises a first rotating shaft, the first rotating shaft penetrates the damping support, and the first swing arm is rotatably connected to the first rotating shaft; and the second rotation assembly further comprises a second rotating shaft, the second rotating shaft penetrates the damping support, and the second swing arm is rotatably connected to the second rotating shaft.

* * * * *